(12) United States Patent
Yoshida et al.

(10) Patent No.: US 7,715,802 B2
(45) Date of Patent: May 11, 2010

(54) FREQUENCY SYNTHESIZER AND MULTI-BAND RADIO APPARATUS USING SAID FREQUENCY SYNTHESIZER

(75) Inventors: Hiroshi Yoshida, Yokohama (JP); Toshiyuki Umeda, Inagi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1224 days.

(21) Appl. No.: 11/252,781

(22) Filed: Oct. 19, 2005

(65) Prior Publication Data

US 2006/0035598 A1    Feb. 16, 2006

Related U.S. Application Data

(62) Division of application No. 09/931,105, filed on Aug. 17, 2001, now Pat. No. 6,985,701.

(30) Foreign Application Priority Data

Aug. 17, 2000    (JP)    .............................. 2000-247703

(51) Int. Cl.
*H04B 1/40*    (2006.01)
(52) U.S. Cl. .................... 455/76; 455/165.1; 455/183.1; 455/260; 455/318; 455/552.1; 375/316; 375/340; 327/105; 327/156
(58) Field of Classification Search .................... 455/76, 455/165.1, 183.1, 260, 318, 552.1; 375/340, 375/316; 327/105, 156
See application file for complete search history.

(56) References Cited

U.S. PATENT DOCUMENTS

| 4,725,786 A | 2/1988 | Papaieck |
| 5,220,684 A | 6/1993 | Suize |
| 5,408,201 A | 4/1995 | Uriya |
| 5,495,202 A * | 2/1996 | Hsu .............................. 327/113 |

(Continued)

FOREIGN PATENT DOCUMENTS

EP    0 238 710    9/1987

(Continued)

OTHER PUBLICATIONS

Simon Atkinson, et al., "A Novel Approach to Direct Conversion RF Receivers for TDMA Applications", MWE '99 Microwave Workshop Digest, Dec. 1999, pp. 53-57.

*Primary Examiner*—Sanh D Phu
(74) *Attorney, Agent, or Firm*—Oblon, Spivak, McClelland, Maier & Neustadt, L.L.P.

(57) ABSTRACT

There is disclosed a frequency synthesizer having an HF synthesizer for generating a first reference frequency signal having a variable frequency in a high-frequency band as a unit synthesizer, an LF synthesizer for generating a second reference frequency signal in a low-frequency band as another unit synthesizer, and an arithmetic circuit including a mixer for receiving the first and second reference frequency signals, a divider for receiving the second reference frequency signal, a mixer for receiving the first reference frequency signal and an output signal from the divider, a divider for receiving an output signal from the mixer, a divider for receiving an output signal from the mixer and capable of switching a division ratio, and a switch for switching and outputting output signals from the dividers, wherein an output signal of the switch is outputted as a first local signal, and an output signal from the divider is outputted as a second local signal.

7 Claims, 13 Drawing Sheets

U.S. PATENT DOCUMENTS

| | | | |
|---|---|---|---|
| 5,497,128 A | 3/1996 | Sasaki | |
| 6,005,446 A * | 12/1999 | Galani et al. | 331/41 |
| 6,574,462 B1 | 6/2003 | Strange | |
| 6,678,503 B1 * | 1/2004 | Black et al. | 455/76 |
| 2005/0059375 A1 | 3/2005 | Abe et al. | |

FOREIGN PATENT DOCUMENTS

| | | |
|---|---|---|
| JP | 3-270512 | 12/1991 |
| JP | 9-298482 | 11/1997 |
| WO | WO 99/30420 | 6/1999 |
| WO | WO 99/45654 | 9/1999 |

\* cited by examiner

FREQUENCY SYNTHESIZER AND MULTI-BAND RADIO APPARATUS USING SAID FREQUENCY SYNTHESIZER

CROSS-REFERENCE TO RELATED APPLICATIONS

This application is based upon and claims the benefit of priority from the prior Japanese Patent Application No. 2000-247703, filed Aug. 17, 2000, the entire contents of which are incorporated herein by reference.

BACKGROUND OF THE INVENTION

1. Field of the Invention

The present invention relates to a frequency synthesizer for generating signals having a plurality of desired frequencies, and also relates to a multi-band radio apparatus using the same.

2. Description of the Related Art

In general, mobile communication terminals are designed for the purpose of using in one communication system. Such a communication system may be a PDC (Personal Digital Cellular) mobile phone system, a mobile phone system conforming to IS-95, or PHS (Personal Handy-phone System). It is quite usual that one mobile communication terminal complies with only-one standard among others of various communication systems existing in the world.

Recently, demand is raised to provide another mobile communication terminal to cope with rapid diversifications of the mobile communication systems. Such a terminal can solely control transmission/reception in response to multiple, different communication systems. For example, so-called "multi-mode terminal" used for both the PDC mobile phone system and the PHS has already been proposed.

In most cases, different mobile communication systems use different frequency bands; therefore, a multi-mode terminal to deal with them should be provided with a "multi-band radio function", i.e., a function of transmitting/receiving data within each of multiple frequency bands.

A direct conversion mode is known as an architecture suitable for realizing such a multi-band radio apparatus. In the apparatus using the direct conversion mode, received signals from an antenna are inputted to one of quadrature demodulators.

To the quadrature demodulator, a pair of local signals for receiver having phases different from each other by 90° are also inputted. They are generated by subjecting local signals output from a frequency synthesizer, to the phase shift by a $\pi/2$ phase shifter. Note that frequencies of the local signals are set with regard to frequencies of desired signals in the received signals.

Because the quadrature demodulator multiplies the received signals by the local signals, the desired signals are converted into baseband signals for an I (Inphase) channel and a Q (Quadrature phase) channel with a center frequency of 0 Hz, which are inputted to a baseband reception section for subsequent signal reproduction processing.

On the other hand, signals to be transmitted for the I channel and the Q channel generated by a baseband transmission section are inputted to the another quadrature modulator.

To a local input port of the quadrature modulator, local signals for transmitter having phases different from each other by 90°, which are generated by subjecting local signals output from the frequency synthesizer to the phase shift by the $\pi/2$ phase shifter are inputted.

Frequencies of the local signals are set to be equal to a transmission frequency. As this quadrature demodulator multiplies the transmission signals by the local signals, the frequencies of the transmission signals are converted into a predetermined transmission frequency.

The frequency synthesizer used in the multi-band radio apparatus must generate local signals in various frequency bands according to realization of the multi-band. Note that this requirement is not limited to the direct conversion mode.

Various modes such as GSM (global system mobile communication) using the 900 MHz band, DCS (digital cellular system) using the 1800 MHz band, PCS (personal communication services) using the 1900 MHz band, UMTS (universal mobile telecommunication system) using the 2 GHz band are extensively utilized in the world. Development of a four-band radio apparatus supposed to be used in all of these frequency bands is desired.

When the frequency synthesizer to cope with such a four-band radio apparatus is realized in compliance with, for instance, the direct conversion mode, there can be considered a method for preparing respective unit synthesizers for: GSM transmission, GSM reception, DCS transmission, DCS reception, PCS transmission, PCS reception, UMTS transmission and UMTS reception by analogy with the method for constituting the frequency synthesizer in the two-band radio apparatus which can cope with both PDS and PHS.

Since the reception frequency band of PCS and the transmission frequency band of UMTS are nearly equal to each other, one synthesizer can function for the both modes. That is, except special cases, unit synthesizers whose number corresponds to a plurality of necessary frequency bands are basically prepared. Therefore, when a number of bands is increased, a number of the unit synthesizers is also proportionately increased, which results in vast hardware.

In preparing the unit synthesizers according to the respective frequency bands in order to realize the multi-band radio apparatus, multiple unit synthesizers are required when a number of bands is increased.

Therefore, the scale of hardware become larger, which leads to increase in size of the multi-mode terminal and the price and the power consumption.

BRIEF SUMMARY OF THE INVENTION

In view of the above-described problems, it is an object of the present invention to provide a frequency synthesizer which comprises a small number of unit synthesizers and has a small circuit scale, and a multi-band radio apparatus using this frequency synthesizer.

To achieve this aim, according to the present invention, there is provided a frequency synthesizer comprising:

a first synthesizer which outputs signal of which frequency is within one of a plurality of frequency bands;

a second synthesizer which outputs a fixed frequency signal;

a first mixer which mixes the signal output from the first synthesizer with the fixed frequency signal output from the second synthesizer;

a first divider which divides a signal output from the first mixer by a first division ratio;

a second divider which divides the fixed frequency signal output from the second synthesizer by a second division ratio;

a second mixer which mixes the signal output from the first synthesizer with a signal output from the second divider;

a third divider which divides a signal output from the second mixer by a third division ratio to output a signal to be used as a first local signal; and a switch which outputs either a signal output from the first divider or a signal output from the third divider as a second local signal.

As described above, in the frequency synthesizer according to the embodiment of the present invention, it is possible to generate signals in a plurality of frequency bands whose number is larger than that of the unit synthesizers by the small-scale circuit configuration in which the two unit synthesizers are combined with the arithmetic circuit comprising dividers and mixers for multiplication.

According to another embodiment of the present invention, there is provided a multi-band radio apparatus comprising:
a frequency synthesizer including:
a first synthesizer which outputs signal of which frequency is within one of a plurality of frequency bands;
a second synthesizer which outputs a fixed frequency signal;
a first mixer which mixes the signal output from the first synthesizer with the fixed frequency signal output from the second synthesizer;
a first divider which divides a signal output from the first mixer by a first division ratio;
a second divider which divides the fixed frequency signal output from the second synthesizer by a second division ratio;
a second mixer which mixes the signal output from the first synthesizer with a signal output from the second divider;
a third divider which divides a signal output from the second mixer by a third division ratio to output a signal to be used as a first local signal; and
a switch which outputs either a signal output from the first divider or a signal output from the third divider as a second local signal;
a quadrature demodulator connected to the frequency synthesizer, which demodulates a received signal by use of the reception local signal; and
a quadrature modulator connected to the frequency synthesizer, which modulates a signal to be transmitted by use of the transmission local signal.

In a multi-band radio apparatus having in a radio portion a quadrature demodulator for demodulating a received signal by a pair of local signals having phases different from each other by 90° or 45° and a quadrature modulator for modulating a pair of transmission signals having phases different from each other by 90° by using a pair of local signals having phases different from each other by 90°, the frequency synthesizer is used to generate the local signals for receiver and the local signals for transmitter. With such a structure, for example, the multi-band radio apparatus adopting the direct conversion mode for both the transmission and reception systems can be realized in a small hardware scale.

Furthermore, in a multi-band radio apparatus having in a radio portion a quadrature demodulator for demodulating a received signal by a pair of local signals having phases different from each other by 90° or 45°, a quadrature modulator for modulating a pair of transmission signals having phases different from each other by 90° by using a pair of first local signals having phases different from each other by 90°, and a frequency converter for converting a frequency of an output signal from the quadrature modulator by using a second local signal, the frequency synthesizer is used to generate the local signals. With such a structure, for example, the multi-band radio apparatus using the direction conversion mode for the reception system and the super heterodyne mode for the transmission system can be realized in the small hardware scale.

DETAILED DESCRIPTION OF THE INVENTION

First Embodiment

Figure 1:
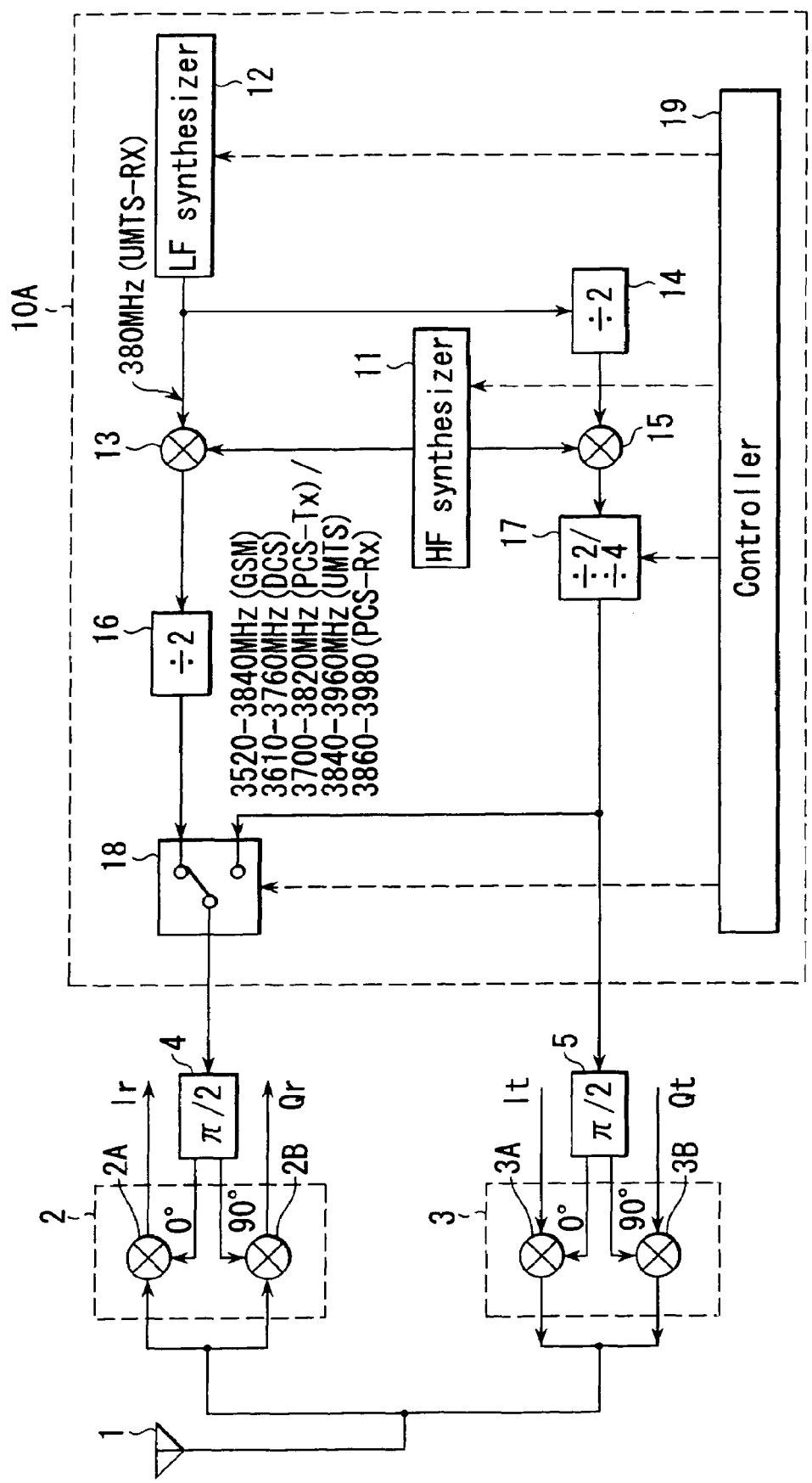
FIG. 1 is a block diagrams showing a structure of a multi-band radio apparatus including a frequency synthesizer according to a first embodiment of the present invention.

FIG. 1 is a block diagram showing a structure of a multi-band radio apparatus including a frequency synthesizer according to a first embodiment of the present invention. The multi-band radio apparatus of this embodiment is a four-band radio apparatus adopting the direct conversion mode conform to GSM/DCS/PCS/UMTS.

A received signal from an antenna 1 is inputted to a quadrature demodulator 2 including two mixers 2A and 2B. When this received signal is multiplied by local signals having phases 0° and 90° inputted from a frequency synthesizer 10A to local input ports of the mixers 2A and 2B through a π/2 phase shifter 4, baseband received signals Ir and Qr for an I channel and a Q channel are generated. The baseband received signals Ir and Qr are inputted to a non-illustrated baseband processing stage.

On the other hand, baseband transmission signals It and Qt for the I channel and the Q channel output from the baseband processing stage are inputted to a quadrature modulator 3 including two mixers 3A and 3B. When these signals are multiplied by local signals having phases 0° and 90° inputted from the frequency synthesizer 10A to local input ports of the mixers 3A and 3B through a π/2 phase shifter 5, RF transmission signals for the I channel and the Q channel are generated. The RF signals for the I channel and the Q channel are combined with each other and transmitted through the antenna 1.

The frequency synthesizer 10A will now be described.

The frequency synthesizer 10A comprises an HF synthesizer 11 for generating a first reference frequency signal having a variable frequency in a high-frequency band and an LF synthesizer 12 for generating a second reference frequency signal in a low-frequency band as unit synthesizers. Here, the terms "high-frequency band" and "low-frequency band" relatively mean that a frequency in the latter band is lower than that in the former band. The HF synthesizer 11 and the LF synthesizer 12 are constituted by using, for example, PLLs.

In the frequency synthesizer 10A of this embodiment, by using the following arithmetic circuit to perform arithmetic operations including frequency division and multiplication to the reference frequency signals output from the HF synthesizer 11 and the LF synthesizer 12 as two unit synthesizers having different frequency bands, output signals having a plurality of necessary frequencies are generated as transmission/local signals in each of GSM/DCS/PCS/UMTS modes.

To a first mixer 13, an output signal from the HF synthesizer 11 as the first reference frequency signal and an output signal from the LF synthesizer 12 as the second reference frequency signal are inputted. The output signal from the LF synthesizer 12 is also inputted to a first divider 14 having a division ratio "2". An output signal from the HF synthesizer 11 and an output signal from the first divider 14 are inputted to a second mixer 15. An output signal from the first mixer 13 is inputted to a second divider 16 having a division ratio "2", and an output signal from the second mixer 15 is inputted to a third divider 17 whose division ratio can be switched between "2" and "4".

A switch 18 switches an output signal from the second divider 16 and an output signal from the third divider 17. An output signal from the switch 18 is outputted as a local signal and inputted to the quadrature demodulator 2 through the π/2 phase shifter 4. An output signal from the third divider 17 is further outputted as a local signal and inputted to the quadrature modulator 3 through the π/2 phase shifter 5.

An output signal frequency of the HF synthesizer 11, an output signal frequency of the LF synthesizer 12, enabling/disabling the operation of the second mixer 15, the division ratio of the third divider 17 and the changeover operation of the switch 18 are controlled by a controller 19 in accordance with an operation mode of the multi-band radio apparatus. It is to be noted that the output signal frequency of the LF synthesizer 12 may be fixed in this embodiment and control executed by the controller 19 is not necessarily required except on/off switching of the LF synthesizer 12. Moreover, a control signal line from the controller 19 to the second mixer 15 is omitted in FIG. 1.

The operation of the frequency synthesizer 10A will now be concretely described in accordance with each operation mode of the multi-band radio apparatus hereinafter. For explaining the operation of the frequency synthesizer 10A, Table 1 shows a concrete frequency structure of four bands, i.e., GSM/DCS/PCS/UMTS.

TABLE 1

|  | GSM | DCS | PCS | UMTS |
| --- | --- | --- | --- | --- |
| Transmission frequency | 880-915 MHz | 1710-1785 MHz | 1850-1910 MHz | 1920-1980 MHz |
| Reception frequency | 925-960 MHz | 1805-1880 MHz | 1930-1990 MHz | 2110-2170 MHz |

[GSM Transmission Mode]

At first, in case of performing transmission in the GSM mode, the output signal frequency of the HF synthesizer 11 is determined as a value within a frequency range of 3520 MHz to 3660 MHz in accordance with the transmission frequency, the second mixer 15 is disabled (allowing the output signal from the HF synthesizer 11 to pass without change), and the division ratio of the third divider 17 is determined as "4". As a result, from the frequency synthesizer 10A is outputted a local signal having a frequency of 880 MHz to 915 MHz obtained by dividing the frequency of 3520 MHz to 3660 MHz by four by the third divider 17, and this local signal is inputted to the quadrature demodulator 3 through the π/2 phase shifter 5.

[GSM Reception Mode]

At second, in case of performing reception in the GSM mode, the output signal frequency of the HF synthesizer 11 is determined as a value within a frequency range of 3700 MHz to 3840 MHz in accordance with the transmission frequency, the second mixer 15 is disabled (allowing the output signal from the HF synthesizer 11 to pass without change), the division ratio of the third divider 17 is determined as "4", and the switch 18 is moved to the lower side (selecting the output signal of the third divider 17). As a result, a local signal having a frequency of 925 MHz to 960 MHz obtained by dividing the frequency of 3700 MHz to 3840 MHz by four by the third divider 17 is outputted from the frequency synthesizer 10A through the switch 18, and this local signal is inputted to the quadrature demodulator 2 through the π/2 phase shifter 4.

In the GSM mode, since communication is carried out in the TDMA (time division multiple access) system, transmission and reception are not simultaneously carried out. Transmission and reception are changed over by switching the output signal frequency of the HF synthesizer 11 in accordance with the timing of transmission/reception as described above.

[DCS Transmission Mode]

At third, in case of performing transmission in the DCS mode, the output signal frequency of the HF synthesizer 11 is determined as a value within a frequency range of 3610 MHz to 3760 MHz in accordance with the transmission frequency, the output signal frequency of the LF synthesizer 12 is determined as 380 MHz, the second mixer 15 is enabled, and the division ratio of the third divider 17 is determined as "2". An output signal of the LF synthesizer 12 is divided by two to be 190 MHz and then inputted to the second mixer 15.

In the second mixer 15, when the output signal from the HF synthesizer 11 and the output signal from the second divider 14 are multiplied together and a difference in frequency of the both signals is detected, an output signal having a frequency within a frequency range of 3420 MHz to 3570 MHz is obtained in accordance with the transmission frequency. By dividing the output signal having a frequency of 3420 MHz to 3570 MHz from the second mixer 15 by two in the third divider 17, the frequency synthesizer 10A outputs a local signal having a frequency of 1710 MHz to 1785 MHz, and this output signal is inputted to the quadrature modulator 3 through the π/2 phase shifter 5.

[DCS Reception Mode]

Subsequently, in case of performing reception in the DCS mode, the output signal frequency of the HF synthesizer 11 is determined as a value in a frequency range of 3610 MHz to 3760 MHz in accordance with the reception frequency, the second mixer 15 is disabled (allowing the output signal from the HF synthesizer 11 to pass without change); the division ratio of the third divider 17 is determined as "2", and the switch 18 is moved to the lower side (selecting the output signal from the third divider 17). As a result, the frequency synthesizer 10A outputs through the switch 18 the local signal having a frequency of 1805 to 1880 MHz obtained by dividing the frequency of 3610 MHz to 3760 MHz by two in the second divider 17, and this output signal is inputted to the quadrature demodulator 2 through the π/2 phase shifter 4.

In the DCS mode, since communication is effected in the TDMA mode as similar to the GSM mode, transmission and reception are not simultaneously carried out. Transmission and reception are changed over by switching disabling/enabling of the second mixer 15 in accordance with the timing of transmission/reception as described above.

[PCS Transmission Mode]

Next, in case of carrying out transmission in the PCS mode, the output signal frequency of the HF synthesizer 11 is determined as a value within a frequency range of 3700 MHz to 3820 MHz in accordance with the transmission frequency, the second mixer 15 is disabled (allowing the output signal from the HF synthesizer to pass without change), and the division ratio of the third divider 17 is determined as "2". As a result, the frequency synthesizer 10A outputs a local signal having a frequency of 1850 MHz to 1910 MHz obtained by dividing the frequency of 3700 MHz to 3820 MHz by two in the third divider 17, and this output signal is inputted to the quadrature modulator 3 through the π/2 phase shifter 5.

[PCS Reception Mode]

Then, in case of performing reception in the PCS mode, the output signal frequency of the HF synthesizer 11 is determined as a value within a frequency range of 3860 MHz to 3980 MHz in accordance with the transmission frequency, the second mixer 15 is disabled (allowing the output signal from the HF synthesizer 11 to pass without change), the division ratio of the third divider 7 is determined as "2", and the switch 18 is moved to the lower side (selecting the output signal from the third divider 17). As a result, the frequency synthesizer 10A outputs through the switch 18 a local signal having a frequency of 1930 MHz to 1990 MHz obtained by dividing the frequency of 3860 MHz to 3980 MHz by two in the second divider 17, and this output signal is inputted to the quadrature demodulator 2 through the π/2 phase shifter 4.

Although there are several PCS modes, since communication is carried out in the TDMA system in case of a mode similar to the GSM mode, transmission and reception are not simultaneously performed. Transmission and reception are changed over by switching the output signal frequency of the HF synthesizer 11 in accordance with the timing of transmission/reception.

[UMTS Transmission Mode]

Then, in case of carrying out transmission in the UMTS mode, the output signal frequency of the HF synthesizer 11 is determined as a value within a frequency range of 3840 MHz to 3960 MHz in accordance with the transmission frequency, the second mixer 15 is disabled (allowing the output signal of the HF synthesizer 11 to pass without change), and the division ratio of the third divider 17 is determined as "2". As a result, the frequency synthesizer 10A outputs a local signal having a frequency of 1920 MHz to 1980 MHz obtained by dividing the frequency of 3840 MHz to 3960 MHz by two in the third divider 17, and this output signal is inputted to the quadrature modulator 3 through the π/2 phase shifter 5.

[UMTS Reception Mode]

Subsequently, in case of performing reception in the UMTS mode, the output signal frequency of the HF synthesizer 11 is determined as a value within a frequency range of 3840 MHz to 3960 MHz in accordance with the transmission frequency, the output signal frequency of the LF synthesizer 12 is determined as 380 MHz, the first mixer 13 is enabled, and the switch 18 is moved to the upper side (selecting the output signal of the second divider 16). In the first mixer 13, a signal having a frequency of 4220 MHz to 4340 MHz is obtained by multiplying the output signal from the HF synthesizer 11 and the output signal from the LF synthesizer 12 together. Consequently, the frequency synthesizer 10A outputs through the switch 18 a local signal having a frequency of 2110 MHz to 2170 MHz obtained by dividing the frequency of 4220 MHz to 4340 MHz by two in the second divider 17, and this output signal is inputted to the quadrature demodulator 2 through the π/2 phase shifter 4.

In case of the UMTS mode, since the CDMA/FDD (code division multiple access/frequency division duplex) system is adopted, transmission and reception are simultaneously carried out. According to the structure of this embodiment, it is possible to simultaneously output the local signals for receiver and transmitter having frequencies required for transmission/reception.

As mentioned above, in the frequency synthesizer 10A of this embodiment, with the simple structure that the two unit synthesizers, i.e., the HF synthesizer 11 and the LF synthesizer 12 are prepared and the mixers 13 and 15, the dividers 14, 16 and 17, and the switch 18 are combined with these synthesizers, it is possible to generate all frequencies required for transmission/reception in each mode of GSM/DCS/PCS/UMTS. Therefore, when a number of unit synthesizers whose circuit scale is large is greatly reduced, the hardware scale can be considerably minimized.

Figure 2:
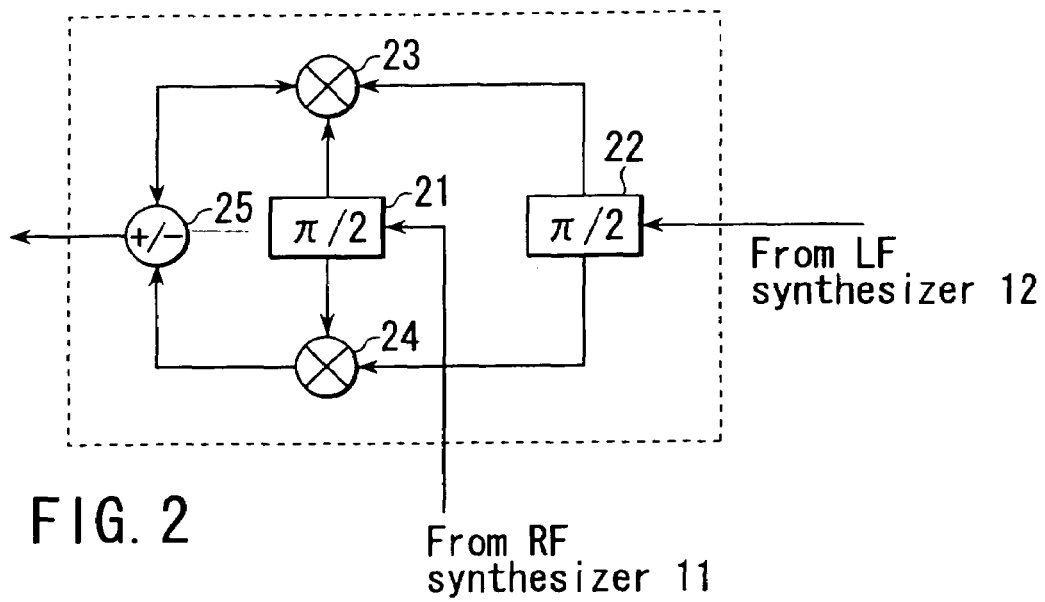
FIG. 2 is a block diagram showing a structural example of an image suppression type mixer.

FIG. 2 shows a structural example of an image suppression type mixer which is suitable as the first mixer 13 and the second mixer 15 depicted in FIG. 1. This mixer comprises π/2 phase shifters 21 and 22, multipliers 23 and 24, and an adder-subtracter 25. This mixer basically multiplies an output signal from the HF synthesizer 11 and an output signal from the LF synthesizer 12 (or a signal obtained by further dividing an output signal from the LF synthesizer 12 by the divider 14) and outputs a signal having a frequency indicative of a sum or a difference of the output signals of the both synthesizers 11 and 12.

In this case, as shown in FIG. 2, the π/2 phase shifters 21 and 22 are used to branch each of output signals from the both synthesizers 11 and 12 into two, and the two multipliers 23 and 24 are then used to carry out the above-described multiplication operation. In addition, the adder-subtracter 25 is used to add (or subtract) the output signals from the multipliers 23 and 24. As a result, the image suppression effect can be obtained. Since approximately 30 dB can be obtained as an image suppression ratio, an image suppression filter which is usually required on a subsequent stage of the mixer can be eliminated in the mixer having the structure shown in FIG. 2.

Other embodiments according to the present invention will now be described. In each drawing of the following embodiments, like reference numerals denote the same constituent parts as those in FIG. 1 to avoid tautological explanation, and a characteristic part of each embodiment will be mainly described.

Second Embodiment

Figure 3:
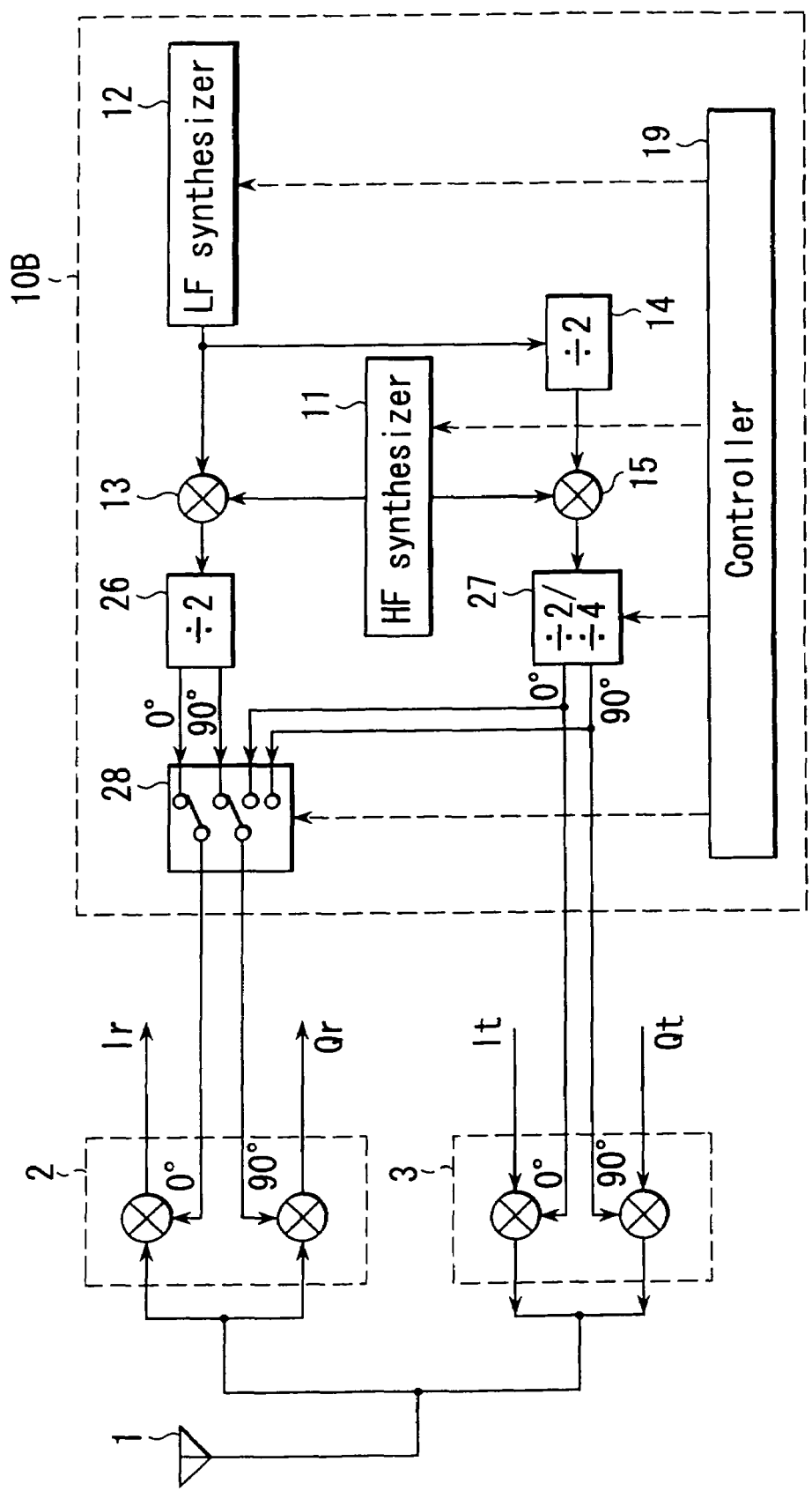
FIG. 3 is a block diagram showing a structure of a multi-band radio apparatus including a frequency synthesizer according to a second embodiment of the present invention.

FIG. 3 shows a structure of a multi-band radio apparatus including a frequency synthesizer according to a second embodiment of the present invention. In the frequency synthesizer 10B of this embodiment, the second and third dividers 16 and 17 in the frequency synthesizer 10A in FIG. 1 are substituted by dividers 26 and 27 which also serve as the π/2 phase shifters, and a switch 28 capable of simultaneously switching signals for two channels is used in place of the switch 18.

Figure 4A:
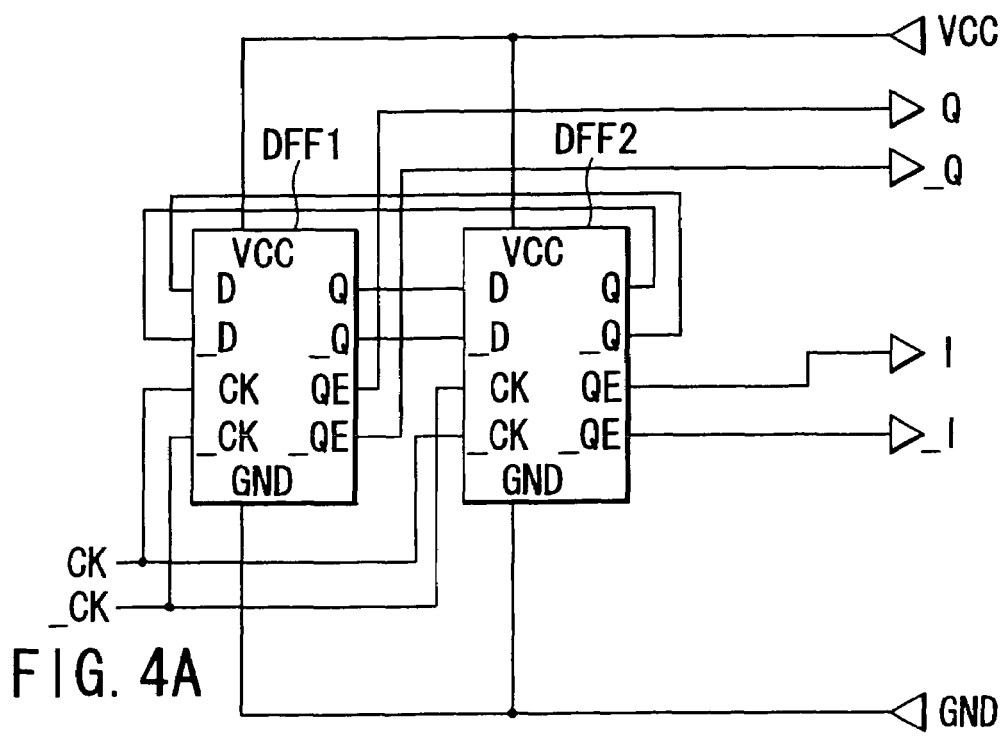
FIG. 4A is a block diagram showing an example of a divider also serving as a π/2 phase shifter.
Figure 4B:
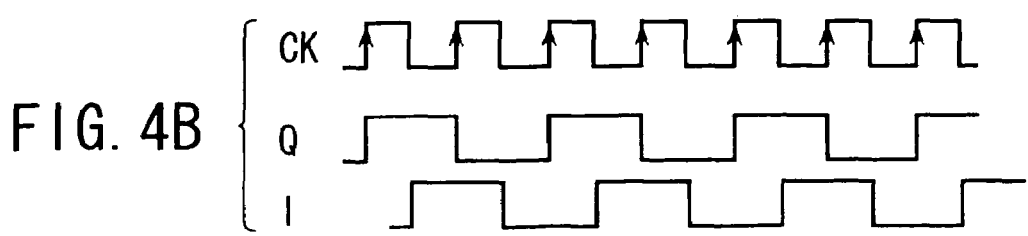
FIG. 4B is a timing chart of the divider also serving as a π/2 phase shifter.

FIG. 4 shows an example of the circuit diagram of dividers also serving as the π/2 phase shifters which are used as the dividers 26 and 27. This divider is realized with two D type flip flops DFF1 and DFF2 as main constituted parts as shown in FIG. 4A. When clock signals are inputted to clock input terminals CK and _CK, a signal I and a signal Q obtained by dividing the clock signal by two are output from a terminal I, _I and a terminal Q, _Q. Although the clock signal, the signal I and the signal Q are treated as differential signals in FIG. 4A, the signal I and the signal Q have a phase difference of 90° as shown in FIG. 4B illustrating only positive phase signals. That is, the divider shown in FIG. 4A also has a function of the π/2 phase shifter.

Therefore, when the divider shown in FIG. 4A is used for the dividers 26 and 27, the signal I and the signal Q outputted from the dividers 26 and 27 can be used as the local signal inputted to the local input port of the quadrature demodulator 2 or the local signal inputted to the local input port of the quadrature modulator 3 as shown in FIG. 3. In addition, the π/2 phase shifters 4 and 5 shown in FIG. 1 are no longer necessary. The switch 28 is constituted so as to be capable of simultaneously switching the signal I and the signal Q outputted from the dividers 26 and 27 also serving as the π/2 phase shifters.

Third Embodiment

Figure 5:
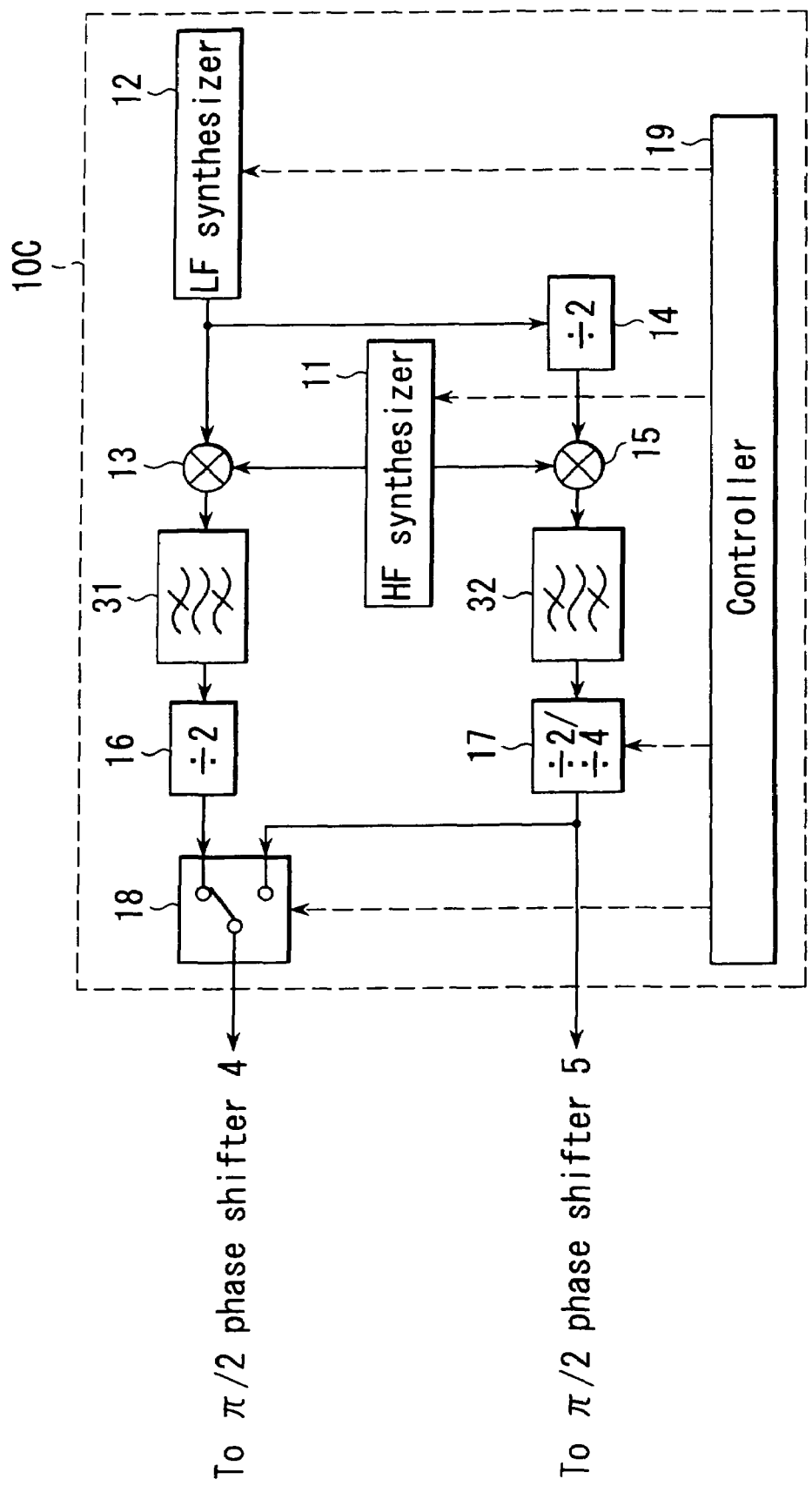
FIG. 5 is a block diagram showing a structure of a multi-band radio apparatus including a frequency synthesizer according to a third embodiment of the present invention.

FIG. 5 shows a structure of a multi-band radio apparatus including a frequency synthesizer according to a third embodiment of the present invention. In the first embodiment, description that the filter on the subsequent stage of the mixer can be eliminated by using such an image suppression type filter as shown in FIG. 2 has been given. However, it is needless to say that inserting the filter to the subsequent stage of the mixer may be preferable depending on unnecessary spurious specifications of the output signal from the frequency synthesizer.

In the frequency synthesizer 10C of this embodiment, band-pass filters 31 and 32 are inserted to the subsequent stages of the mixers 13 and 15. These filters 31 and 32 may be constituted by combining discrete components such as a coil (L), a capacitor (C) or a resistor (R), or by using filter components formed as modules such as an LC laminated filter, a dielectric filter, or an SAW (surface acoustic wave) filter. Additionally, these filters can be realized in a simpler structure by constituting the band-pass filters 31 and 32 by low-pass filters or high-pass filters depending on the frequency concern.

Fourth Embodiment

In the direct conversion mode, in order to suppress deterioration of the reception characteristic caused due to generation of the DC offset, a harmonic mixer may be used in the quadrature demodulator on the reception side. The harmonic mixer is different from a regular mixer, and a signal having a frequency which is ½ of the reception frequency is used as a local signal.

Figure 6:
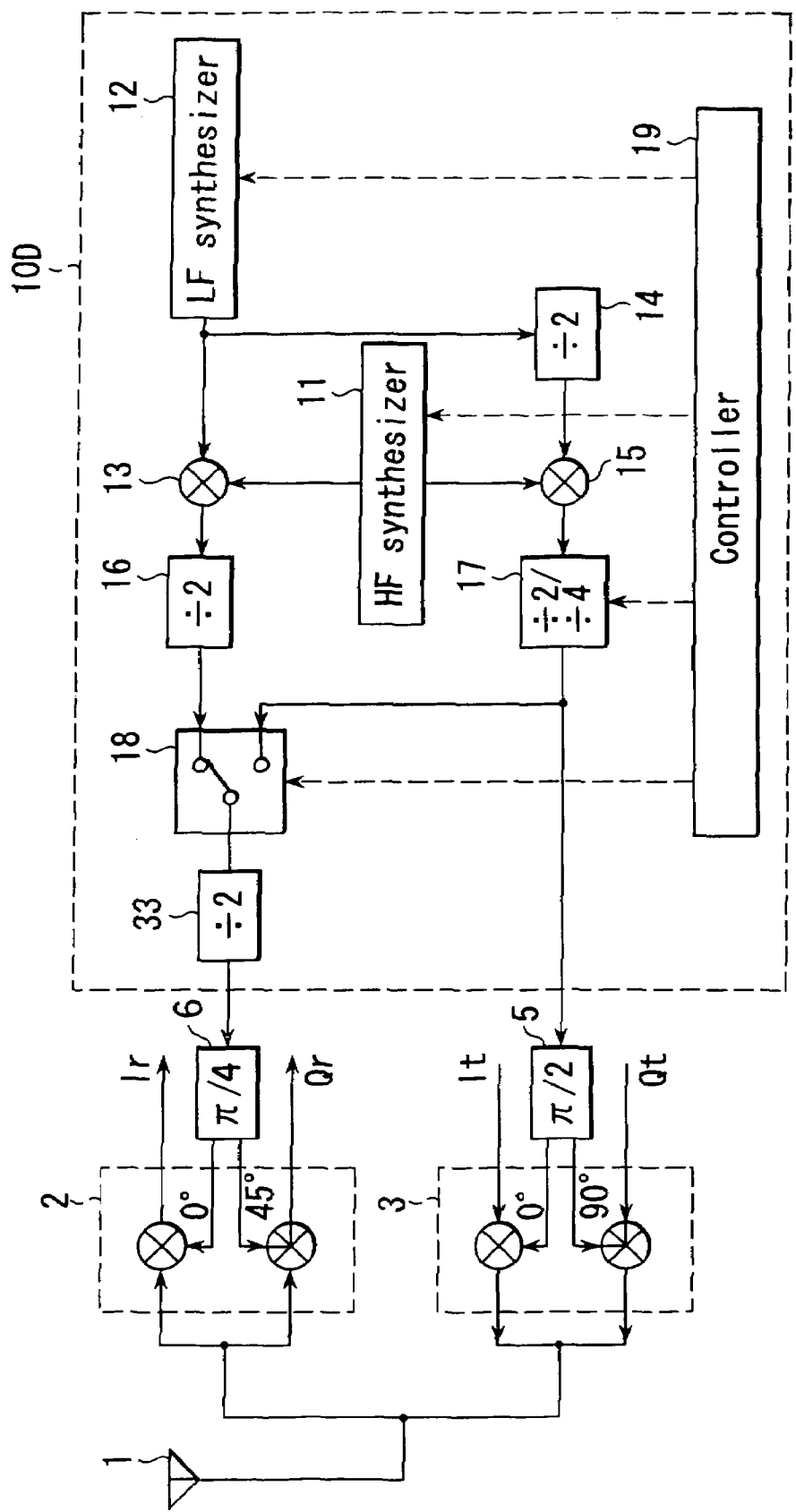
FIG. 6 is a block diagrams showing a structure of a multi-band radio apparatus including a frequency synthesizer according to a fourth embodiment of the present invention.

FIG. 6 shows a structure in case of using the harmonic mixer in the quadrature demodulator 2 as a fourth embodiment according to the present invention. In the frequency synthesizer 10D of this embodiment, a fourth divider 33 is inserted on the subsequent stage of the switch 18. The division ratio of the fourth divider 33 is "2" and used for generating a local signal having a frequency which is ½ of the reception frequency and required in the quadrature demodulator 2 having the harmonic mixer structure.

Incidentally, when utilizing the harmonic mixer, since a phase difference of the local signals to be supplied to the two mixers must be 45° in the quadrature demodulator 2, the π/2 phase shifter 6 is used in place of the π/2 phase shifter 4 shown in FIG. 1.

Fifth Embodiment

Figure 7:
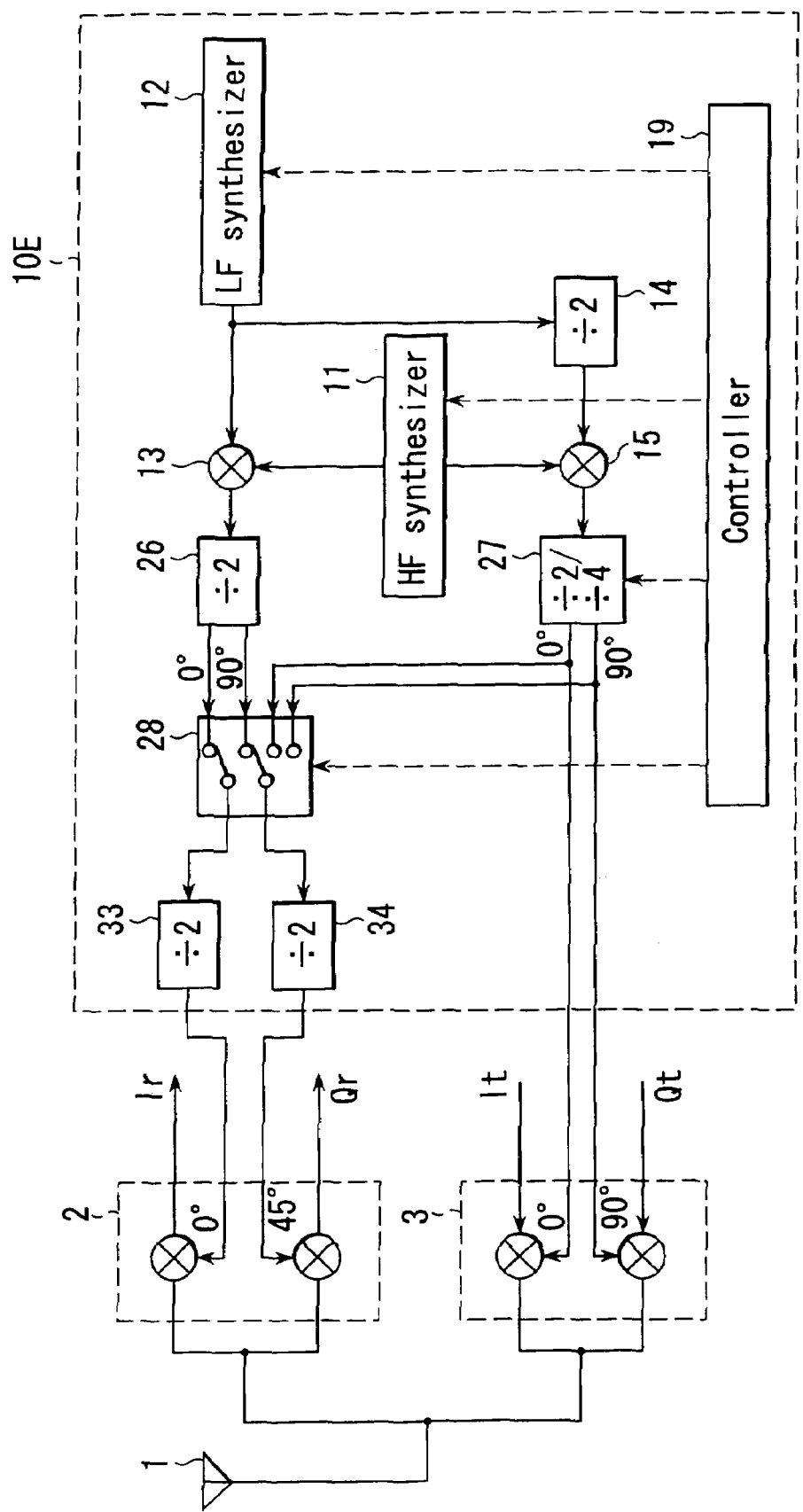
FIG. 7 is a block diagram showing a structure of a multi-band receiver including a frequency synthesizer according to a fifth embodiment of the present invention.

FIG. 7 shows a structure according to a fifth embodiment of the present invention obtained by improving the fourth embodiment illustrated in FIG. 6. In the frequency synthesizer 10E of this embodiment, second and third dividers 26 and 27 also serving as the π/2 phase shifters and the switch 18 capable of simultaneously switching signals for two channels are used as similar to the second embodiment illustrated in FIG. 3, and a fifth divider 34 having the division ratio of "2" which also functions as the π/2 phase shifter is added as well as the fourth divider 33 depicted in FIG. 6.

By dividing each of signals having a phase 0° outputted from the second and third dividers 26 and 27 by two in the fourth divider 33 through the switch 28, these signals are outputted as the local signals having a phase 0°. Further, by dividing each of signals having a phase 90° outputted from the dividers 26 and 27 by two by the fifth divider 34 which also functions as the π/2 phase shifter through the switch 28, these signals are outputted as the local signals having a phase 45°.

As described above, according to this embodiment, since the two local signals having a phase difference of π/4 in total are obtained, the FIG. 6 π/4 phase shifter 6 used in the fourth embodiment can be eliminated.

Sixth Embodiment

Figure 8:
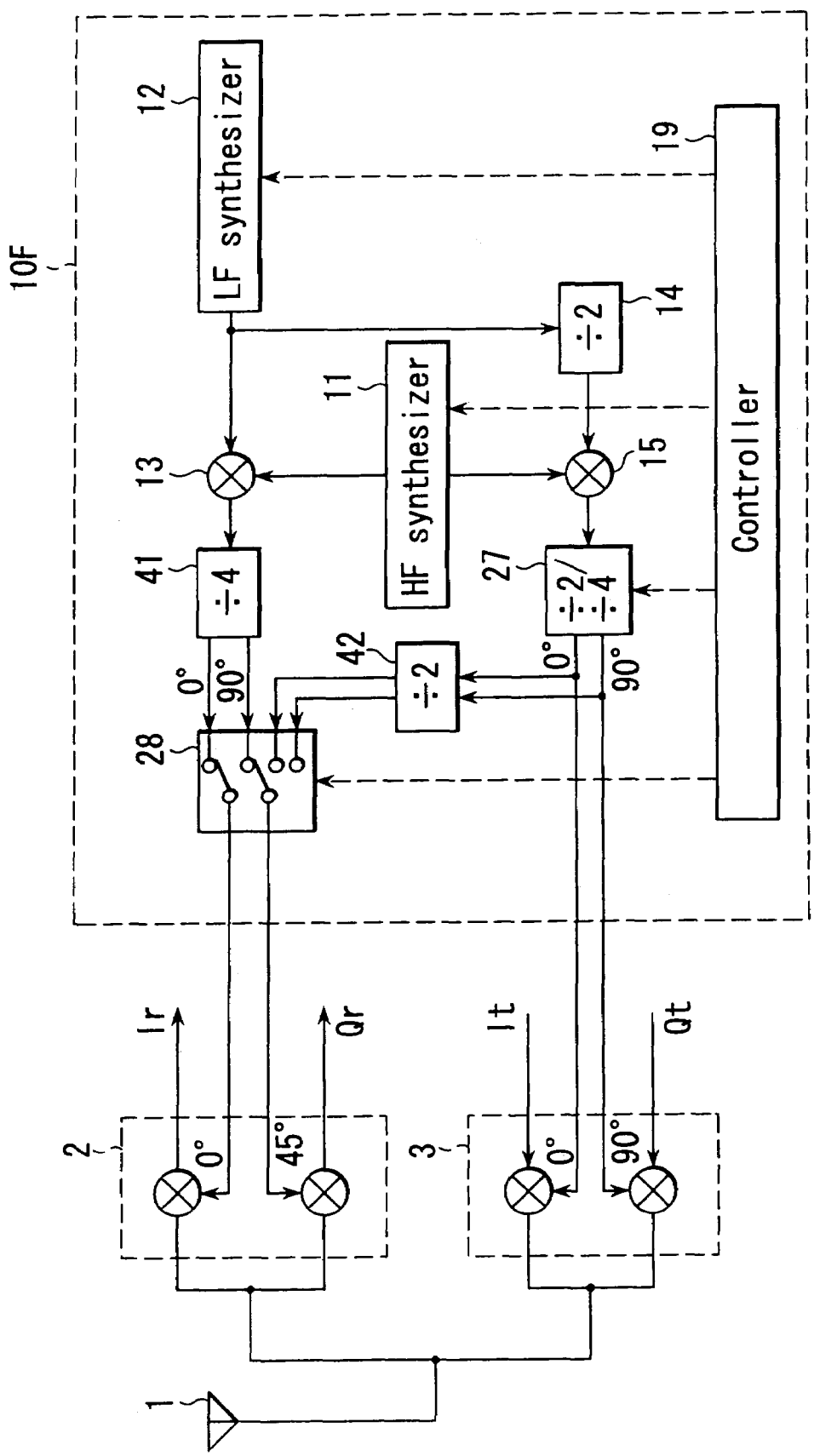
FIG. 8 is a block diagram showing a structure of a multi-band receiver including a frequency synthesizer according to a sixth embodiment of the present invention.

FIG. 8 shows another structural example in case of using the harmonic mixers in the quadrature demodulator 2 as a sixth embodiment according to the present invention. In the frequency synthesizer 10F of this embodiment, the first divider 26 having the division ratio "2" depicted in FIG. 7 is substituted by a divider 41 having the division ratio "4", and a fourth divider 42 having the division ratio "2" is inserted between the third divider 27 and the switch 28. Moreover, the dividers 33 and 34 illustrated in FIG. 7 are removed.

According to this embodiment, since the dividers 41 and 42 can also function as the π/4 phase shifters, the effects similar to those of the fifth embodiment shown in FIG. 7 can be obtained because the π/4 phase shifter required for the harmonic mixers can be eliminated.

Seventh Embodiment

All of the first to sixth embodiments mentioned above are examples in which the present invention is applied to the multi-band radio apparatus using the direct conversion mode in both the transmission system and the reception system. Description will now be given as an example that the present invention is applied to the multi-band radio apparatus in which the direct conversion mode is used only in the reception system and the super heterodyne mode is used in the transmission system as shown in FIG. 9 as a seventh embodiment according to the present invention.

Figure 9:
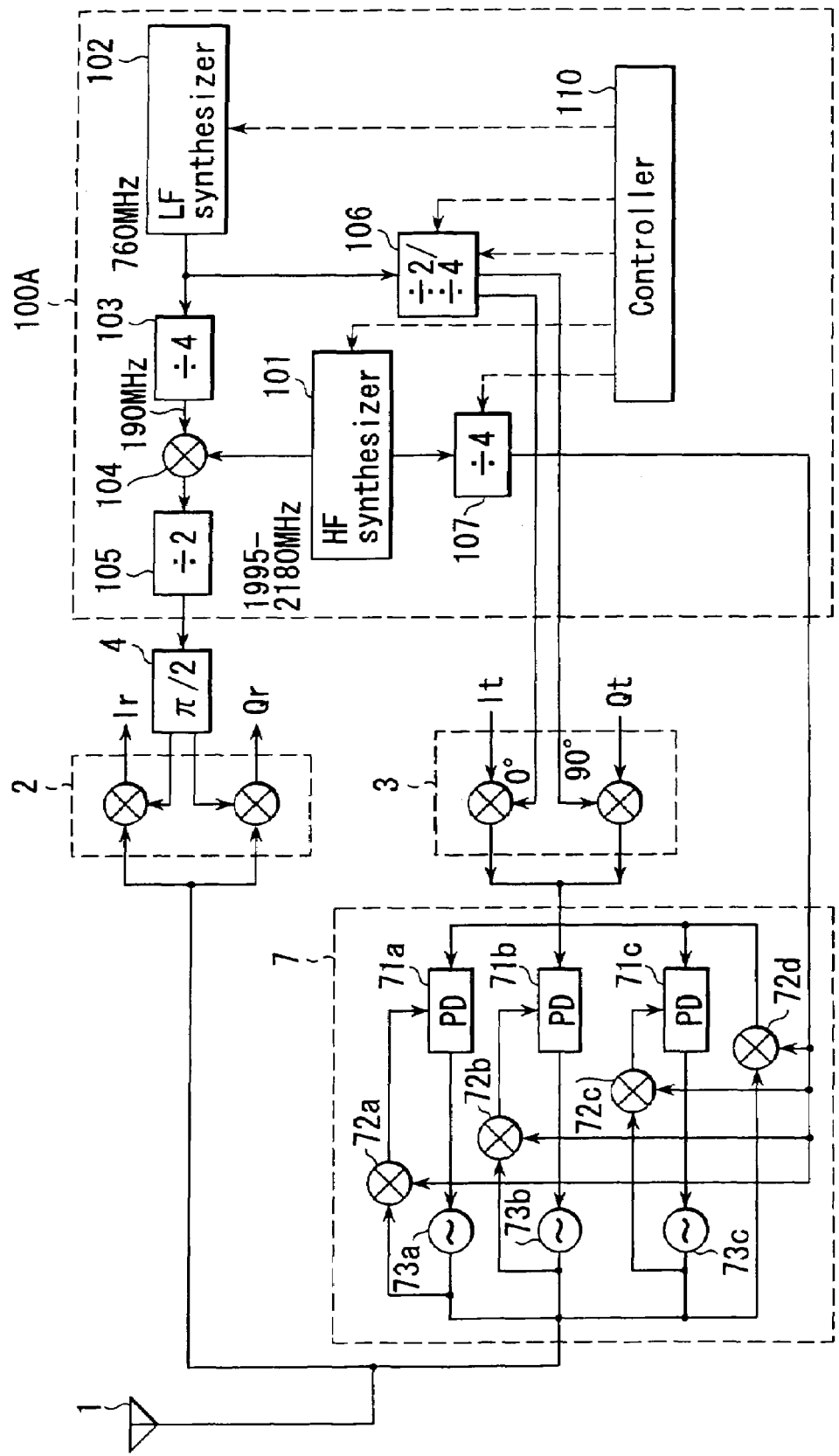
FIG. 9 is a block diagram showing a structure of a multi-band receiver including a frequency synthesizer according to a seventh embodiment of the present invention.

In FIG. 9, a frequency converter 7 is inserted between the quadrature modulator 3 of the transmission system and the antenna 1. In this case, the quadrature modulator 3 is used as an intermediate frequency converter. That is, baseband transmission signals It and Qt for the I channel and the Q channel are converted into intermediate frequency signals by the quadrature modulator 3, then up-converted by the frequency converter 7, and supplied to the antenna 1.

The frequency converter 7 is constituted by phase comparators 71a to 71c, down converters 72a to 72c, an up converters 72d and VCOs (voltage control oscillators) 73a to 73c. Suffixes a, b and c indicate systems for GSM, DCS and PCS, and the up converter 72d is used for UMTS. The phase comparators 71a to 71c compare output signals from VCOs 73a to 73c with output signals from down converters 72a to 72c, and output signals indicative of phase differences between these signals. Oscillation frequencies of the VCOs 73a to 73c are controlled by the output signals from the phase comparators 71a to 71c. The down converters 72a to 72c down-convert output signals from the VCOs 73a to 73c by using a first local signal inputted from the later-described frequency synthesizer 100A.

This structure seems to be complicated transmission system structure as compared with the multi-band radio apparatus adopting the direct conversion mode, but the quadrature modulator 3 of the transmission system can be shared by all the modes. Further, when the direct conversion mode is used in both transmission and reception, although the output signal frequency of the quadrature modulator 3 coincides with the transmission frequency, the output frequency of the quadrature modulator 3 becomes the intermediate frequency in this embodiment.

When the super heterodyne mode is adopted in the transmission mode in this way, the structure of the frequency synthesizer is changed by the intermediate frequency of the transmission system. However, if the intermediate frequency is 380 MHz in GSM/DCS and 190 MHz in PCS/UMTS, the frequency synthesizer can be realized by the most simplest structure. Output signal frequencies of the frequency synthesizer in this case will be shown in Table 2 in order.

TABLE 2

|  | GSM | DCS | PCS | UMTS |
|---|---|---|---|---|
| Transmission first LO | 380 MHz | 380 MHz | 190 MHz | 190 MHz |
| Transmission second LO | 500-535 MHz | 2090-2165 MHz | 2040-2100 MHz | 2110-2170 MHz |
| Reception LO | 925-960 MHz | 1805-1880 MHz | 1930-1990 MHz | 2110-2170 MHz |

The frequency synthesizer 101A of this embodiment shown in FIG. 9 is configured to generate such frequencies. The frequency synthesizer 100A comprises an HF synthesizer 101 for generating a first reference frequency signal in a high-frequency band and an LF synthesizer 102 for generating a second reference frequency signal in a low-frequency band for unit synthesizers. In the frequency synthesizer 10A, output signals having necessary frequencies are generated by performing arithmetic operations including multiplication and frequency division by the following arithmetic circuit with respect to the reference frequency signals outputted from the HF synthesizer 101 and the LF synthesizer 102 as two unit synthesizers having different frequency bands.

An output signal from the LF synthesizer 102 is divided by the first divider 103 having the division ratio "4". The first mixer 104 multiplies an output signal from the HF synthesizer 101 and an output signal from the first divider 103 together. An output signal from the first mixer 104 is divided by a second divider 105 having the division ratio "2" and then inputted to the quadrature demodulator 2 through the π/2 phase shifter 4 as a local signal.

The output signal from the LF synthesizer 102 is also divided by a third divider 17 which can switch the division ratio between "2" and "4", and then inputted to the quadrature modulator 3 as a transmission first local signal. Furthermore, the output signal from the HF synthesizer 101 is inputted to the frequency converter 7 through a fourth divider 107 having the division ratio "4" as a transmission second local signal.

The output signal frequency of the HF synthesizer 101, the output signal frequency of the LF synthesizer 102, enabling/disabling the first mixer 104, enabling/disabling the second divider 105, the division ratio of the third divider 106, and enabling/disabling the fourth divider 107 are controlled by a controller 110 in accordance with an operation mode of the multi-band radio apparatus. The output signal frequency of the LF synthesizer 102 may be fixed in this embodiment, and control effected by the controller 110 is not necessarily required. Moreover, a control signal line from the controller 110 to the mixer 104 is eliminated in FIG. 9.

The operation of the frequency synthesizer 100A will now be concretely described in accordance with each operation mode of the multi-band radio apparatus.

[GSM Transmission Mode]

At first, in case of performing transmission in the GSM mode, the output signal frequency of the HF synthesizer 101 is determined as a value within a frequency range of 2000 MHz to 2140 MHz in accordance with the transmission frequency, the output signal frequency of the LF synthesizer 102 is determined as 760 MHz, and the division ratio of the third divider 106 is determined as "2". In this case, the frequency synthesizer 100A outputs a signal having a frequency of 380 MHz obtained by dividing 760 MHz by two in the third divider 106, and this signal is inputted to the quadrature modulator 3 as a transmission first local signal.

In addition, a signal having a frequency of 500 MHz to 535 MHz obtained by dividing the output signal frequency 2000 MHz to 2140 MHz of the HF synthesizer 101 by four using the fourth divider 107 is outputted as a transmission second local signal and inputted to the frequency converter 7.

[GSM Reception Mode]

Subsequently, in case of performing reception in the GSM mode, the output signal frequency of the HF synthesizer 101 is determined as a value within a frequency range of 2040 MHz to 2110 MHz in accordance with the transmission frequency, the output signal frequency of the LF synthesizer 102 is determined as 760 MHz, and the mixer 104 is enabled. The output signal from the LF synthesizer 102 is divided by two to be 190 MHz by the first divider 103 and then inputted to the mixer 104.

In the mixer 104, the output signal from the HF synthesizer 101 and the output signal from the first divider 103 are multiplied together, and a difference frequency component of the both signals is extracted. As a result, an output signal having a frequency in a frequency range of 1850 MHz to 2300 MHz is obtained in accordance with the transmission frequency.

When the output signal having a frequency of 1850 MHz to 2300 MHz from the second mixer 15 is divided by in the second divider 105, a signal having a frequency of 925 MHz to 1785 MHz is outputted from the frequency synthesizer 100A as the local signal and then inputted to the quadrature demodulator 2 through the π/2 phase shifter 4.

In the GSM mode, since communication is effected in the TDMA system, transmission and reception are not simultaneously carried out. Transmission and reception are changed over by switching the output signal frequency of the HF synthesizer 101 in accordance with the timing of transmission/reception.

[DCS Transmission Mode]

Then, in case of carrying out transmission in the DCS mode, the output signal frequency of the HF synthesizer 101 is determined as a value in a frequency range of 2090 MHz to 2165 MHz in accordance with the transmission frequency, the output signal frequency of the LF synthesizer 102 is determined as 760 MHz, the division ratio of the third divider 106 is determined as "2", and the fourth divider 107 is disabled (allowing the output signal from the HF synthesizer 101 to pass without being divided). In this case, the frequency synthesizer 100A outputs a signal having a frequency of 380 MHz obtained by dividing 760 MHz by two in the third divider 106 as a transmission first local signal, and this signal is inputted to the quadrature modulator 3.

Moreover, the output signal having a frequency of 2090 MHz to 2165 MHz from the HF synthesizer 101 is output as a transmission second local signal without being divided by the fourth divider 107 and inputted to the frequency converter 7.

[DCS Reception Mode]

Subsequently, in case of performing reception in the DCS mode, the output signal frequency of the HF synthesizer 101 is determined as a value in a frequency range of 1995 MHz to 2070 MHz in accordance with the reception frequency, the output signal frequency of the LF synthesizer 102 is determined as 760 MHz, the third divider 103 is enabled, the mixer 104 is enabled, and the second divider 105 is disabled (allowing the output signal from the mixer 104 to pass without being divided). The output signal from the LF synthesizer 102 is divided by four to be 190 MHz in the second divider 103 and then inputted to the mixer 104.

In the mixer 104, by multiplying the output signal from the HF synthesizer 101 and the output signal from the first divider 103 together, an output signal having a frequency in a frequency range of 1805 MHz to 1880 MHz is obtained in accordance with the reception/transmission frequency. The output signal having a frequency of 1805 MHz to 1880 MHz from the mixer 105 is outputted from the frequency synthesizer 101A as a local signal without being divided by the second divider 105, and inputted to the quadrature demodulator 2 through the π/2 phase shifter 4.

In the DCS mode, since communication is carried out in the TDMA system as similar to the GSM mode, transmission and reception are not simultaneously performed. Transmission and reception is changed over by switching the frequency of the HF synthesizer 10 in accordance with the timing of transmission/reception.

[PCS Transmission Mode]

Then, in case of effecting transmission in PCS, the output signal frequency of the HF synthesizer 101 is determined as a value within a frequency range of 2040 MHz to 2100 MHz in accordance with the transmission frequency, the output signal frequency of the LF synthesizer 102 is determined as 760 MHz, the division ratio of the third divider 106 is determined as "4", and the fourth divider 107 is disabled (allowing the output signal from the HF synthesizer 101 to pass without being divided). In this case, the frequency synthesizer 100A outputs a signal having a frequency of 190 MHz obtained by dividing 760 MHz by four in the third divider 106 as a transmission first local signal, and this signal is inputted to the quadrature modulator 3.

Furthermore, the output signal having a frequency of 2040 MHz to 2100 MHz from the HF synthesizer 101 is outputted as a transmission second local signal without being divided by the fourth divider 107, and inputted to the frequency converter 7.

[PCS Reception Mode]

Then, in case of carrying out reception in PCS, the output signal frequency of the HF synthesizer 101 is determined as a value within a frequency range of 2120 MHz to 2180 MHz in accordance with the transmission frequency, the output signal frequency of the LF synthesizer 102 is determined as 760 MHz, the mixer 104 is enabled, the second divider 105 is enabled, and the fourth divider 107 is disabled (allowing the output signal of the HF synthesizer 101 to pass without being divided). The output signal from the LF synthesizer 102 is divided by four to be 190 MHz in the first divider 103 and then inputted to the mixer 104.

In the mixer 104, by multiplying the output signal from the HF synthesizer 101 and the output signal of the first divider 103 together, there is obtained an output signal having a frequency within a frequency range of 1930 MHz to 2100 MHz in accordance with the transmission frequency. The output signal having a frequency of 1930 MHz to 2100 MHz from the second mixer 104 is outputted from the frequency synthesizer 100A as a local signal without being divided by the second divider 105, and inputted to the quadrature demodulator 2 through the π/2 phase shifter 4.

In the PCS mode, since communication is carried out in the TDMA system as similar to the GSM mode, transmission and reception are not simultaneously performed. Transmission and reception are changed over by switching the output signal frequency of the HF synthesizer 101 in accordance with the timing of transmission/reception.

[UMTS Transmission Mode]

Subsequently, in case of effecting transmission in the UMTS mode, the output signal frequency of the HF synthesizer 101 is determined as a value within a frequency range of 2110 MHz to 2170 MHz in accordance with the transmission frequency, the output signal frequency of the LF synthesizer 102 is determined as 760 MHz, the division ratio of the third divider 106 is determined as "4", and the fourth divider 107 is disabled (allowing the output signal from the HF synthesizer 101 to pass without being divided). In this case, the frequency synthesizer 100A outputs a signal having a frequency of 190 MHz obtained by dividing 760 MHz by four in the third divider 106 as a transmission first local signal, and this signal is inputted to the quadrature modulator 3.

Moreover, the output signal having a frequency of 2110 MHz to 2170 MHz from the HF synthesizer 101 is outputted as a transmission second local signal without being divided by the fourth divider 107, and inputted to the frequency converter 7.

[UMTS Reception Mode]

Then, in case of performing reception in the UMTS mode, the output signal frequency of the HF synthesizer 101 is determined as 2110 MHz to 2170 MHz similarly as in transmission, the mixer 104 is disabled (allowing the output signal from the mixer 104 to pass without modification), and the second divider 105 is disabled (allowing the output signal of the mixer 104 to pass without being divided). The output signal of the LF synthesizer 102 is divided by four to be 190

MHz in the first divider 103, and then passes through the mixer 104 without modification. In addition, this signal is outputted from the frequency synthesizer 100A as a local signal without being divided by the second divider 105, and inputted to the quadrature demodulator 2 through the π/2 phase shifter 4.

In case of the UMTS mode, since communication is carried out in the CDMA/FDD system, transmission and reception are simultaneously effected. According to the structure of this embodiment, the transmission first and second local signals and the local signal for receiver which have frequencies required for transmission/reception can be simultaneously outputted at this moment.

As described above, in the frequency synthesizer 100A in this embodiment, with the structure that only the HF synthesizer 101 and the LF synthesizer 102 are prepared as the unit synthesizers and the dividers 103, 105, 106 and 107 and the mixer 104 are combined with these synthesizers, it is also possible to generate all frequencies required for transmission/reception in each mode of GMS/DCS/PCS/UMTS. Therefore, great reduction in a number of the unit synthesizers having a large circuit scale can considerably decrease the hardware scale.

In addition, since the transmission first local signal having 0° and 90° obtained by necessarily dividing the output signal from the LF synthesizer 102 by four or two in the third divider 106 is supplied to the quadrature modulator 3 in the transmission system, the divider 106 can also serve as the π/2 phase shifter.

Eighth Embodiment

Figure 10:
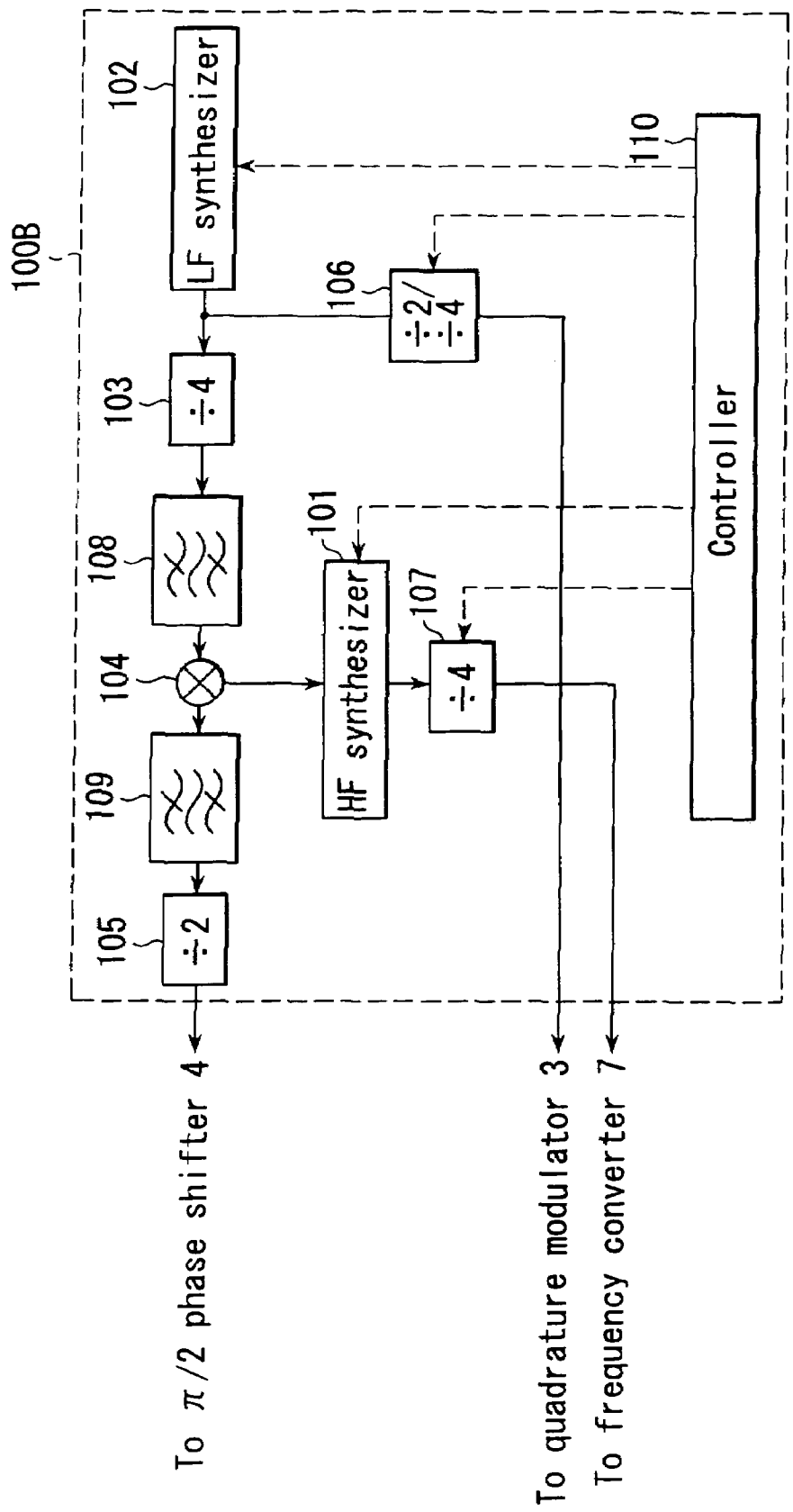
FIG. 10 is a block diagram showing a structure of a frequency synthesizer according to an eighth embodiment of the present invention.

FIG. 10 shows a structure of a frequency synthesizer according to an eighth embodiment of the present invention. In the eighth embodiment, although a filter on the subsequent stage of the mixer 104 can be eliminated by using such an image suppression type filter as shown in FIG. 2, it is needless to say that insertion of the filter to the subsequent stage of the mixer 104 or the subsequent stage of the first divider 103 may be preferable depending on unnecessary spurious specifications of the output signal of the frequency synthesizer.

In the frequency synthesizer 100B of this embodiment, band-pass filters 108 and 109 are inserted to the subsequent stage of the first divider 103 and the subsequent stage of the mixer 104, respectively. These filters 108 and 109 may be configured by combining discrete components such as a coil (L), a capacitor (C) or a resistor (R), or filter components formed into modules such as an LC laminated filter, a dielectric filter or an SAW (surface acoustic wave) filter may be used for these filters. Additionally, the present invention can be realized with a simpler structure by configuring the band-pass filters 31 and 32 by low-pass filters or high-pass filters depending on frequency concerns.

Ninth Embodiment

Figure 11:
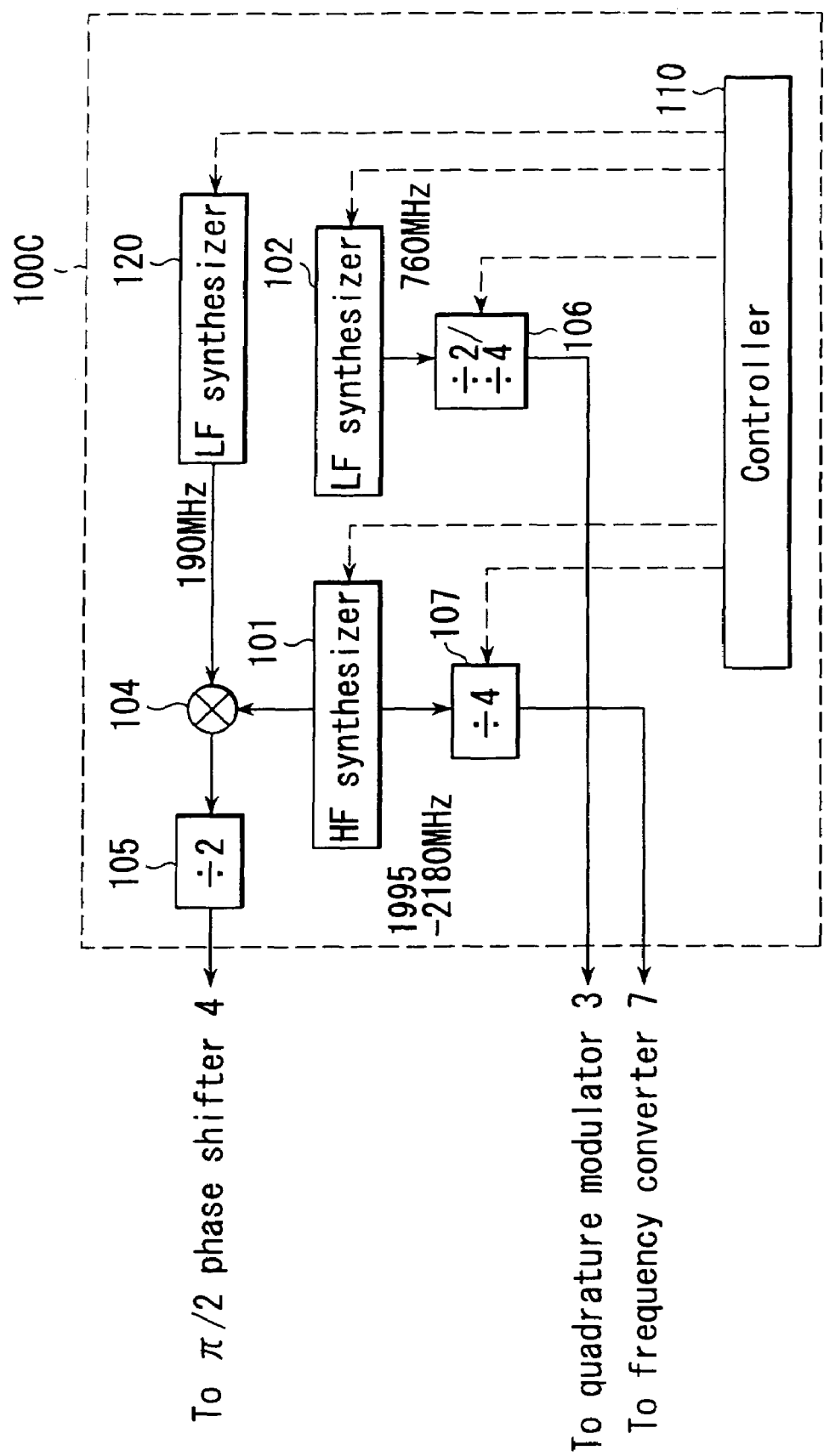
FIG. 11 is a block diagram showing a structure of a frequency synthesizer according to a ninth embodiment of the present invention.

FIG. 11 shows a structure of a frequency synthesizer according to a ninth embodiment of the present invention. In the frequency synthesizer 100C of this embodiment, a second LF synthesizer 120 is added. In the frequency synthesizer 100A according to the seventh embodiment depicted in FIG. 9, a signal having a frequency of 190 MHz is generated by dividing an output signal having a frequency of 760 MHz from the LF synthesizer 102 by the first divider 103. On the other hand, in this embodiment, the newly provided second LF synthesizer 120 is used to generate a signal having a frequency of 190 MHz.

Although an output signal from the divider 103 shown in FIG. 9 has rectangular waves, an output signal from the second LF synthesizer 120, i.e., a signal inputted to the mixer 104 can have sinusoidal waves according to this embodiment. As compared with the case where the output signal of the divider 103 is inputted to the mixer 104 as shown in FIG. 9, it is possible to reduce the necessity of adding the band restriction by the filter 108 such as shown in FIG. 10.

Tenth Embodiment

Figure 12:
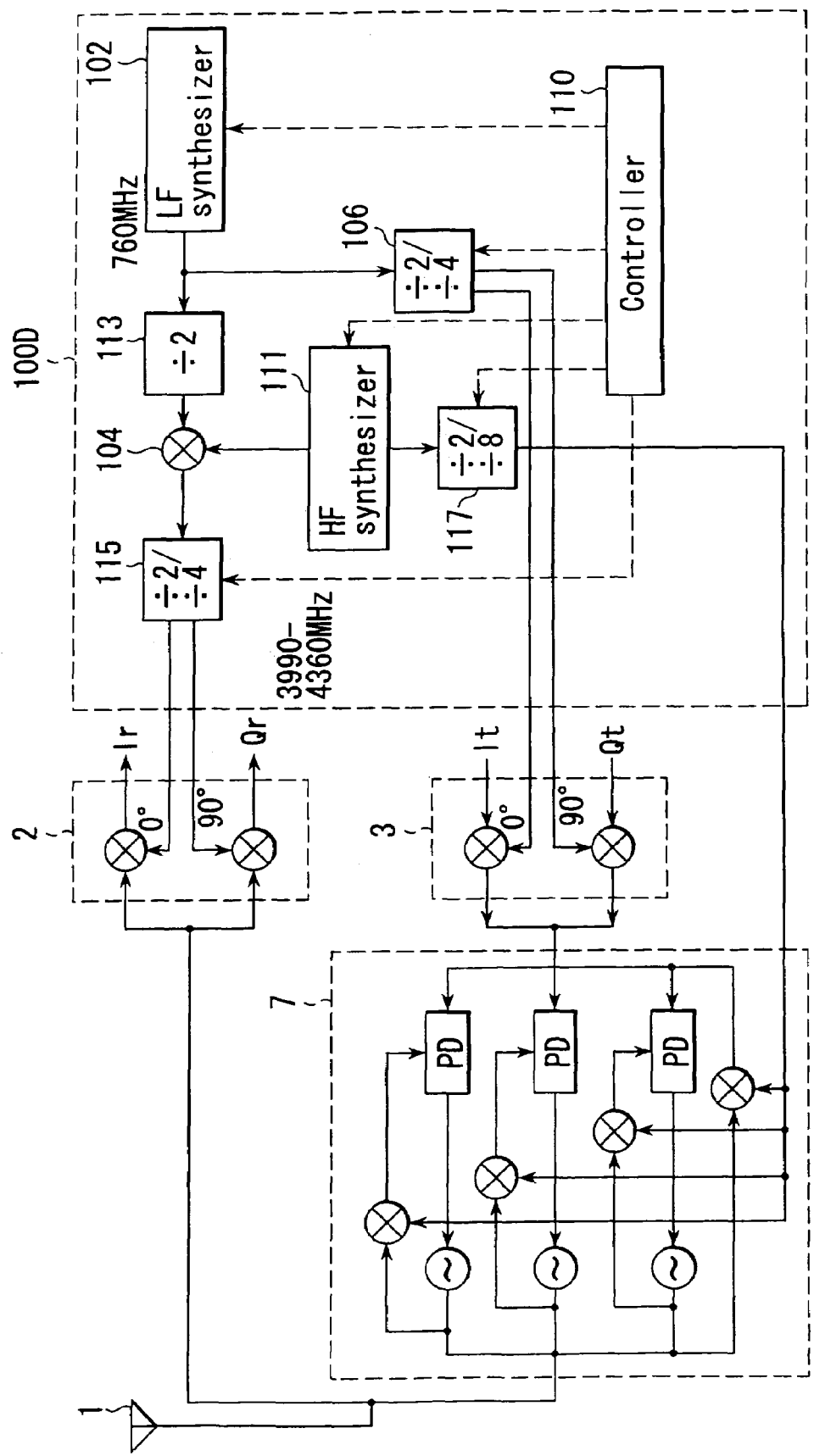
FIG. 12 is a block diagrams showing a structure of a multi-band receiver including a frequency synthesizer according to a tenth embodiment of the present invention.

FIG. 12 shows a structure of a multi-band radio apparatus including a frequency synthesizer according to a tenth embodiment of the present invention. Giving description as to a difference of this embodiment from the seventh to ninth embodiments, in the frequency synthesizer 100D of this embodiment, an HF synthesizer 111 for generating a signal having a frequency which is twice as high as that of the HF synthesizer 101 is used; the first divider for dividing an output signal from the LF synthesizer 102 is changed from the divider 103 having the division ratio "4" to the divider 113 having the division ratio "2"; the second divider for dividing an output signal from the mixer 104 is changed to the divider 115 capable of switching the division ratio between "2" and "4"; and the fourth divider for dividing an output signal from the HF synthesizer 111 is changed to the divider 117 capable of switching the division ratio between "2" and "8".

In the frequency synthesizer 100A having the structure shown in FIG. 9, since a signal to be outputted to the reception side is not necessarily divided by two, the π/2 phase shifter 4 is required on the local signal input side of the quadrature demodulator 2. However, since the divider for dividing a frequency by two is also necessarily provided in the reception system in the structure of the frequency synthesizer 100 according to this embodiment, this divider can also function as the π/2 phase shifter.

Eleventh Embodiment

Figure 13:
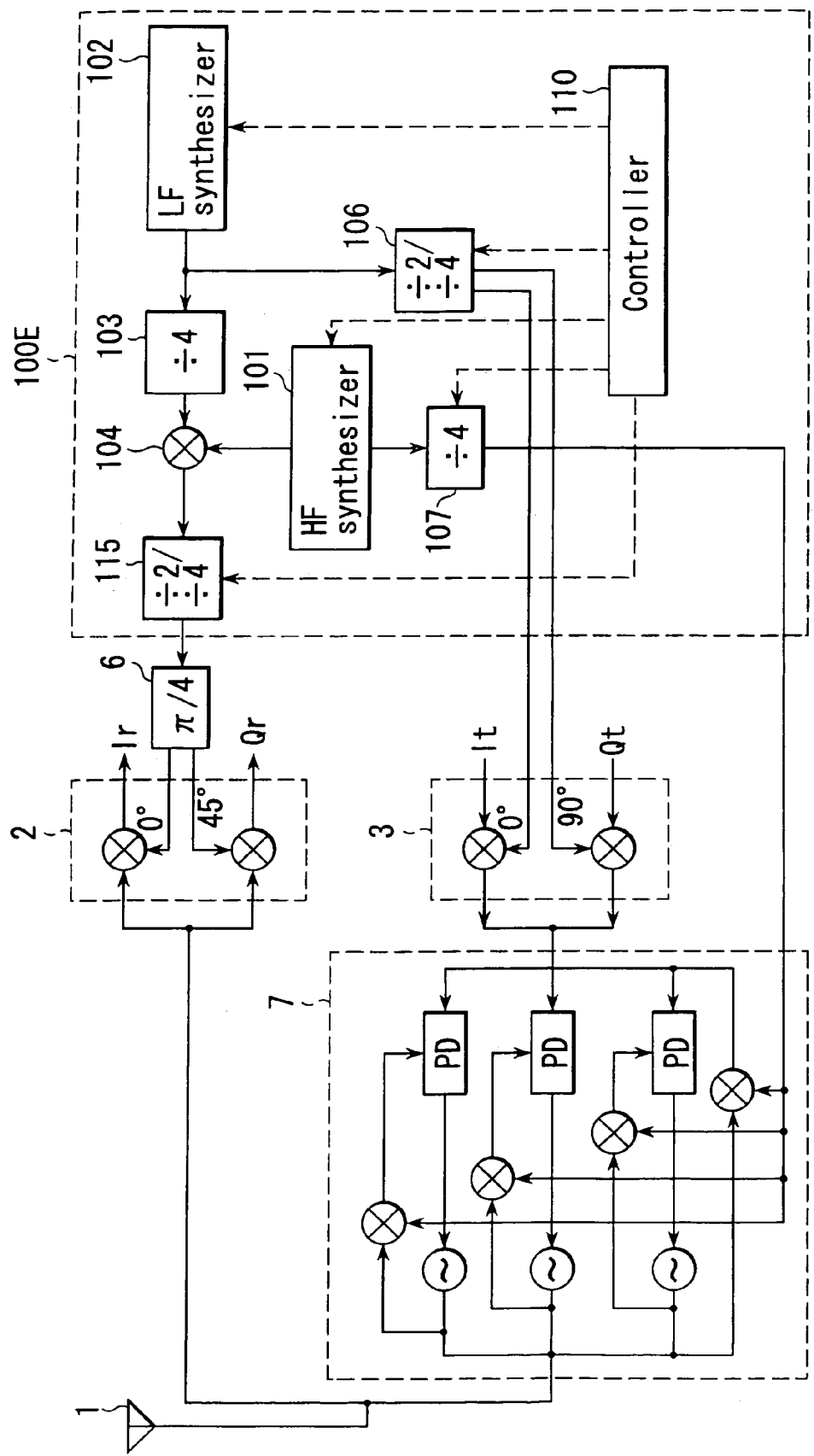
FIG. 13 is a block diagram showing a structure of a multi-band receiver including a frequency synthesizer according to an eleventh embodiment of the present invention.

FIG. 13 shows a structure of a multi-band radio apparatus including a frequency synthesizer according to an eleventh embodiment of the present invention. In the structure using the direct conversion mode in the reception system and-the super heterodyne mode in the transmission system as similar to the seventh to tenth embodiments, this embodiment corresponds to a case of using the harmonic mixers in the quadrature demodulator 2 in the reception system similarly as described in the fourth embodiment. In this case, the frequency synthesizer 101E can be realized by a fewer constituent elements.

The frequency synthesizer 100E in this embodiment is different from the frequency synthesizer 100A shown in FIG. 9 of the seventh embodiment in that the second divider 105 is substituted by the divider 115 capable of switching the division ratio between "2". and "4". Further, in case of utilizing the harmonic mixers, since a phase difference of the local signals supplied to the two mixers in the quadrature demodulator 2 must be set to 45°, the π/2 phase shifter 4 shown in FIG. 9 is substituted by the π/4 phase shifter 6.

As to the operation of this frequency synthesizer 10E, in description of the operation of the seventh embodiment, the divider 115 in FIG. 13 is operated with the division ratio "4" when the divider 105 is activated, and the divider 115 is operated with the division ratio "2" when the divider 105 is disabled (allowing the output signal from the mixer 104 to pass without being divided). As a result, it is possible to obtain from the divider 115 the local signal having a frequency which is ½ of the reception frequency required in the quadrature demodulator 2 having the harmonic mixer structure.

Twelfth Embodiment

Figure 14:
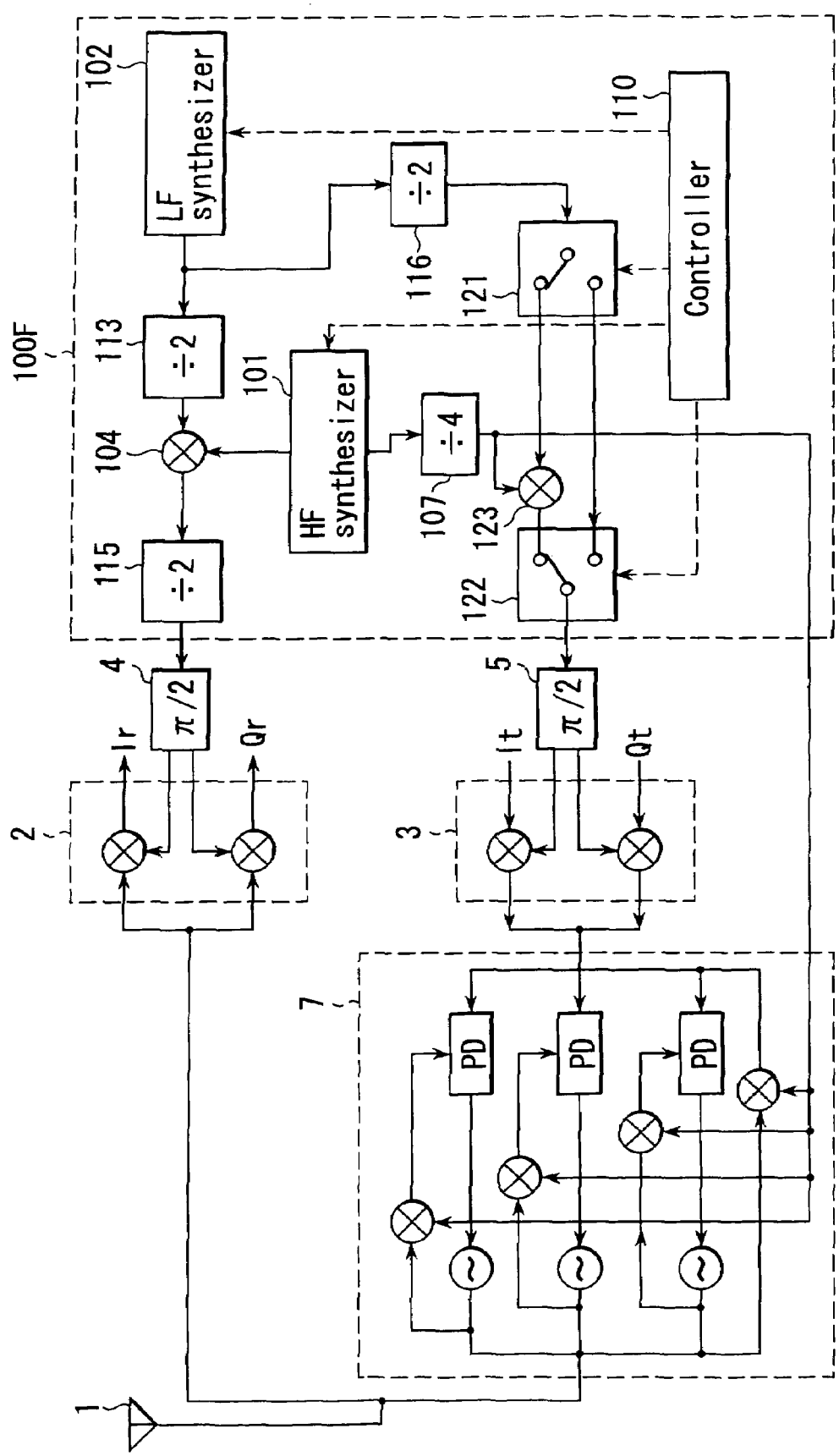
FIG. 14 is a block diagram showing a structure of a multi-band receiver including a frequency synthesizer according to a twelfth embodiment of the present invention.

FIG. 14 shows a structure of a multi-band radio apparatus including a frequency synthesizer according to a twelfth embodiment of the present invention. Although all of the frequency synthesizers 100A to 100E described in the seventh to eleventh embodiments are configured to adopt the super heterodyne mode in the transmission system, the frequency synthesizer 100F of this embodiment corresponds to an example in which the super heterodyne mode is adopted in the transmission system for each mode of GSM/DCS/PCS and the direct conversion mode is adopted for only the UMTS mode.

The structure of the frequency synthesizer 100F of this embodiment is similar to that of the frequency synthesizer 100A shown in FIG. 9 but very different in that switches 121 and 122 and a second mixer 123 are added. Further, the output signal frequency of the LF synthesizer 102 is changed from 760 MHz to 380 MHz, and hence the first divider is changed to the divider 115 having the division ratio "2" and the third divider is changed to the divider 116 having the division ratio "2", respectively.

The added second mixer 123 multiplies an output signal from the HF synthesizer 101 by a signal transmitted through the fourth divider 107, and multiplies an output signal from the LF synthesizer 102 by a signal subjected to division by two in the third divider 116. The switches 121 and 122 are provided for switching an output signal from the divider 116 and an output signal from the second mixer 123 and outputting a resulting signal as a transmission first local signal.

In this frequency synthesizer 100F, although the same operation as that of the frequency synthesizer 100A shown in FIG. 9 is carried out in the three modes of GSM/DCS/PCS, the local signal matched with the transmission frequency required for the direct conversion mode can be obtained by the added second mixer 123 in the UMTS mode. That is, the switches 121 and 123 are changed over so as not to energize the mixer 123 in case of the GSM/DCS/PCS modes, and they are changed over so as to energize the mixer 123 in the UMTS mode.

Giving further concrete description as to the operation in case of performing transmission in the UMTS mode, the output signal frequency of the HF synthesizer 101 is determined as a value within a frequency range of 2110 MHz to 2170 MHz in accordance with the transmission frequency, the output signal frequency of the LF synthesizer 102 is determined as 380 MHz, and the fourth divider 107 is disabled (allowing the output signal from the HF synthesizer 101 to pass without being divided).

In this case, the frequency synthesizer 100F outputs the local signal having the same frequency as the transmission frequency of 1920 MHz to 1990 MHz (see Table 1) obtained by multiplying in the second mixer 123 a signal having a frequency of 190 MHz obtained by dividing 380 MHz by two in the third divider 116 and a signal having a frequency of 2110 MHz to 2170 MHz from the HF synthesizer 101 which has passed through the fourth divider 107. This output signal is inputted to the quadrature modulator 3. At this moment, the frequency converter 7 is controlled to be disabled (allowing the output signal from the quadrature modulator 3 to pass without modification).

Although the above has described the case the present invention is applied to the multi-band radio apparatus conform to the four modes of GSM/DCS/PCS/UMTS in the foregoing embodiments, the present invention can be also applied to the multi-band radio apparatus conform to arbitrary two modes or three modes of these four modes. Furthermore, the present invention includes a multi-band radio apparatus conform to five communication modes that another communication mode is added to these four modes, or any other apparatus as long as it has a structure for generating signals (local signals) in a plurality of (three or more) frequency bands exceeding a number of unit synthesizers by combining at least two unit synthesizers including the HF synthesizer and the LF synthesizer with the arithmetic circuit comprising of the dividers and the mixers.

As described above, according to the frequency synthesizer of the present invention, it is possible to generate signals in a plurality of frequency bands exceeding a number of unit synthesizers with a small circuit scale structure comprising two unit synthesizers for basically producing reference frequency signals in a high-frequency band and a low-frequency band.

Furthermore, this frequency synthesizer can be used to realize a multi-band radio apparatus which can be utilized in two or more frequency bands with a small hardware scale.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi-band radio apparatus comprising: a frequency synthesizer including:
    a first synthesizer which outputs signal of which frequency is within one of a plurality of frequency bands;
    a second synthesizer which outputs a fixed frequency signal;
    a first mixer which mixes the signal output from the first synthesizer with the fixed frequency signal output from the second synthesizer;
    a first divider which divides a signal output from the first mixer by a first division ratio;
    a second divider which divides the fixed frequency signal output from the second synthesizer by a second division ratio;
    a second mixer which mixes the signal output from the first synthesizer with a signal output from the second divider;
    a third divider which divides a signal output from the second mixer by a third division ratio to output a signal to be used as a first local signal;
    a switch which outputs either a signal output from the first divider or a signal output from the third divider as a second local signal;
    a quadrature demodulator connected to the frequency synthesizer, which demodulates a received signal by use of said second local signal; and
    a quadrature modulator connected to the frequency synthesizer, which modulates a signal to be transmitted by use of said first local signal;
    wherein said first divider includes a first $\pi/2$ phase shifter and said third divider includes a second $\pi/2$ phase shifter, and wherein said switch outputs first and second phase signals having phases different from each other by $\pi/2$.

2. The multi-band radio apparatus of claim 1, further comprising a fourth divider which divides a signal output from said switch by a fourth division ratio, and a fifth divider which divides a signal output from said switch by a fifth division ratio.

3. The multi-band radio apparatus of claim 1, further comprising a fourth divider inserted between said third divider and said switch.

4. A multi-band radio apparatus comprising: a frequency synthesizer including:
- a first synthesizer which outputs signal of which frequency is within one of a plurality of frequency bands;
- a second synthesizer which outputs a fixed frequency signal;
- a first mixer which mixes the signal output from the first synthesizer with the fixed frequency signal output from the second synthesizer;
- a first divider which divides a signal output from the first mixer by a first division ratio;
- a second divider which divides the fixed frequency signal output from the second synthesizer by a second division ratio;
- a second mixer which mixes the signal output from the first synthesizer with a signal output from the second divider;
- a third divider which divides a signal output from the second mixer by a third division ratio to output a signal to be used as a first local signal;
- a switch which outputs either a signal output from the first divider or a signal output from the third divider as a second local signal;
- a quadrature demodulator connected to the frequency synthesizer, which demodulates a received signal by use of said second local signal;
- a quadrature modulator connected to the frequency synthesizer, which modulates a signal to be transmitted by use of said first local signal; and
- a first filter inserted between said first mixer and said first divider, and a second filter inserted between said second mixer and said third divider.

5. A multi-band radio apparatus comprising: a frequency synthesizer including:
- a first synthesizer which outputs signal of which frequency is within one of a plurality of frequency bands;
- a second synthesizer which outputs a fixed frequency signal;
- a first mixer which mixes the signal output from the first synthesizer with the fixed frequency signal output from the second synthesizer;
- a first divider which divides a signal output from the first mixer by a first division ratio;
- a second divider which divides the fixed frequency signal output from the second synthesizer by a second division ratio;
- a second mixer which mixes the signal output from the first synthesizer with a signal output from the second divider;
- a third divider which divides a signal output from the second mixer by a third division ratio to output a signal to be used as a first local signal;
- a switch which outputs either a signal output from the first divider or a signal output from the third divider as a second local signal;
- a quadrature demodulator connected to the frequency synthesizer, which demodulates a received signal by use of said second local signal;
- a quadrature modulator connected to the frequency synthesizer, which modulates a signal to be transmitted by use of said first local signal; and
- a fourth divider which divides a signal output from said switch by a fourth division ratio.

6. A multi-band radio apparatus comprising:
a frequency synthesizer including:
- a first synthesizer which outputs a signal of which frequency is within one of a plurality of frequency bands;
- a second synthesizer which outputs a fixed frequency signal;
- a first divider which divides the fixed frequency signal output from the second synthesizer by a first division ratio;
- a mixer which mixes the signal output from the first synthesizer with a signal output from the first divider;
- a second divider which divides a signal output from the mixer by a second division ratio to output a first local signal;
- a third divider which divides the fixed frequency signal output from the second synthesizer by a third division ratio to output a second local signal; and
- a fourth divider which divides the signal output from the first synthesizer by a fourth division ratio to output a third local signal;
- a quadrature demodulator connected to the frequency synthesizer, which demodulates a received signal by use of said first local signal;
- a quadrature modulator connected to the frequency synthesizer, which modulates a signal to be transmitted by use of said second local signal; and a frequency converter connected to the quadrature modulator and the frequency synthesizer, which converts a frequency of a signal output from the quadrature modulator by use of said third local signal; and
- a first filter inserted between said first divider and said mixer, and a second filter inserted between said mixer and said second divider.

7. A multi-band radio apparatus comprising:
a frequency synthesizer including:
- a first synthesizer which outputs a signal of which frequency is within one of a plurality of frequency bands;
- a second synthesizer which outputs a fixed frequency signal;
- a first divider which divides the fixed frequency signal output from the second synthesizer by a first division ratio;
- a mixer which mixes the signal output from the first synthesizer with a signal output from the first divider;
- a second divider which divides a signal output from the mixer by a second division ratio to output a first local signal;
- a third divider which divides the fixed frequency signal output from the second synthesizer by a third division ratio to output a second local signal;
- a fourth divider which divides the signal output from the first synthesizer by a fourth division ratio to output a third local signal;
- a quadrature demodulator connected to the frequency synthesizer, which demodulates a received signal by use of said first local signal;
- a quadrature modulator connected to the frequency synthesizer, which modulates a signal to be transmitted by use of said second local signal; and a frequency converter connected to the quadrature modulator and the frequency synthesizer, which converts a frequency of a signal output from the quadrature modulator by use of said third local signal;
- a second mixer which mixes a signal output from said fourth divider with a signal output from said third divider; and
- a switch which outputs either a signal output from the second mixer or a signal output from the third divider as a second local signal.

* * * * *